(12) United States Patent
Takahashi

(10) Patent No.: US 11,086,175 B2
(45) Date of Patent: Aug. 10, 2021

(54) DISPLAY DEVICE AND ELECTRONIC APPLIANCE

(71) Applicant: SEMICONDUCTOR ENERGY LABORATORY CO., LTD., Atsugi (JP)

(72) Inventor: Kei Takahashi, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/846,519

(22) Filed: Apr. 13, 2020

(65) Prior Publication Data

US 2020/0310187 A1   Oct. 1, 2020

Related U.S. Application Data

(63) Continuation of application No. 16/325,226, filed as application No. PCT/IB2017/054713 on Aug. 2, 2017, now Pat. No. 10,642,110.

(30) Foreign Application Priority Data

Aug. 17, 2016 (JP) .................................. 2016-159846

(51) Int. Cl.
*G02F 1/1345* (2006.01)
*H01L 29/786* (2006.01)
(Continued)

(52) U.S. Cl.
CPC ........ *G02F 1/13452* (2013.01); *G02F 1/1345* (2013.01); *G02F 1/1368* (2013.01);
(Continued)

(58) Field of Classification Search
CPC ............ G02F 1/13452; H01L 27/1225; H01L 29/7869; H01L 27/124; H01L 29/786
(Continued)

(56) References Cited

U.S. PATENT DOCUMENTS 7,164,151 B2   1/2007   Yamazaki et al.
7,166,966 B2   1/2007   Naugler, Jr. et al.
(Continued)

FOREIGN PATENT DOCUMENTS

CN   001641878 A   7/2005
CN   102799306 A   11/2012
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Thinh T Nguyen
(74) *Attorney, Agent, or Firm* — Fish & Richardson P.C.

(57) ABSTRACT

A display device with a narrow frame is provided. A display device with high visibility is provided. A display device with low power consumption is provided. A novel display device is provided.

A structure having a stack structure in which a gate driver including a first transistor and a common driver including a second transistor which includes a metal oxide in its channel formation region are stacked has been conceived. Because the gate driver has a larger area than the common driver, part of the gate driver may be formed on the same plane as the common driver.

2 Claims, 14 Drawing Sheets

(51) Int. Cl.
*G06F 3/044* (2006.01)
*G02F 1/1368* (2006.01)
*H01L 27/12* (2006.01)
*G02F 1/1333* (2006.01)
*G06F 3/041* (2006.01)

(52) U.S. Cl.
CPC .......... *G06F 3/0445* (2019.05); *G06F 3/0446* (2019.05); *H01L 27/124* (2013.01); *H01L 27/1225* (2013.01); *H01L 29/786* (2013.01); *H01L 29/7869* (2013.01); *G02F 1/13338* (2013.01); *G06F 3/044* (2013.01); *G06F 3/0412* (2013.01); *G06F 2203/04103* (2013.01)

(58) Field of Classification Search
USPC ........... 257/43, 59, 72; 438/85, 86, 104, 154
See application file for complete search history.

(56) References Cited

U.S. PATENT DOCUMENTS

| | | | |
|---|---|---|---|
| 7,271,409 B2 | 9/2007 | Young et al. | |
| 7,306,981 B2 | 12/2007 | Kuwabara et al. | |
| 7,479,673 B2 | 1/2009 | Jang et al. | |
| 7,746,333 B2 | 6/2010 | Yamazaki et al. | |
| 7,833,851 B2 | 11/2010 | Kuwabara et al. | |
| 8,044,946 B2 | 10/2011 | Yamazaki et al. | |
| 8,148,236 B2 | 4/2012 | Takahashi et al. | |
| 8,384,699 B2 | 2/2013 | Yamazaki et al. | |
| 8,674,368 B2 | 3/2014 | Takahashi et al. | |
| 8,791,916 B2 | 7/2014 | Mizuhashi et al. | |
| 9,041,453 B2 | 5/2015 | Miyake et al. | |
| 9,141,247 B2 | 9/2015 | Mizuhashi et al. | |
| 9,429,800 B2 | 8/2016 | Yamazaki et al. | |
| 9,478,187 B2 | 10/2016 | Miyake et al. | |
| 9,679,954 B2 | 6/2017 | Takamaru | |
| 9,685,131 B2 | 6/2017 | Tanaka et al. | |
| 9,715,318 B2 | 7/2017 | Mizuhashi et al. | |
| 9,864,473 B2 | 1/2018 | Mizuhashi et al. | |
| 10,013,131 B2 | 7/2018 | Mizuhashi et al. | |
| 10,120,475 B2 | 11/2018 | Abe et al. | |
| 10,203,829 B2 | 2/2019 | Mizuhashi et al. | |
| 2005/0001211 A1 | 1/2005 | Yamazaki et al. | |
| 2005/0179061 A1 | 8/2005 | Jang et al. | |
| 2005/0200296 A1 | 9/2005 | Naugler et al. | |
| 2006/0220077 A1 | 10/2006 | Hayashi et al. | |
| 2007/0126969 A1 | 6/2007 | Kimura et al. | |
| 2008/0023728 A1 | 1/2008 | Jang et al. | |
| 2009/0140270 A1 | 6/2009 | Takahashi et al. | |
| 2012/0262387 A1 | 10/2012 | Mizuhashi et al. | |
| 2015/0021596 A1 | 1/2015 | Yamazaki et al. | |
| 2015/0145833 A1 | 5/2015 | Yamazaki | |
| 2015/0155334 A1 | 6/2015 | Lu et al. | |
| 2015/0187814 A1 | 7/2015 | Miyairi et al. | |
| 2015/0214374 A1 | 7/2015 | Hara et al. | |
| 2015/0249053 A1 | 9/2015 | Or-Bach et al. | |
| 2015/0279916 A1 | 10/2015 | Takamaru | |
| 2015/0332919 A1 | 11/2015 | Yamazaki | |
| 2016/0019856 A1* | 1/2016 | Tanaka et al. | G09G 3/3666 |
| 2016/0372672 A1 | 12/2016 | Yamazaki et al. | |
| 2017/0228077 A1 | 8/2017 | Abe et al. | |
| 2018/0012536 A1 | 1/2018 | Shishido | |
| 2018/0026037 A1 | 1/2018 | Shishido et al. | |
| 2019/0034015 A1 | 1/2019 | Abe et al. | |

FOREIGN PATENT DOCUMENTS

| | | |
|---|---|---|
| CN | 104769658 A | 7/2015 |
| CN | 105164743 A | 12/2015 |
| CN | 107045217 A | 8/2017 |
| DE | 102005000997 | 8/2005 |
| EP | 2065937 A | 6/2009 |
| EP | 2916310 A | 9/2015 |
| JP | 2000-047259 A | 2/2000 |
| JP | 2003-152191 A | 5/2003 |
| JP | 2004-247373 A | 9/2004 |
| JP | 2005-203777 A | 7/2005 |
| JP | 2009-151293 A | 7/2009 |
| JP | 2012-230657 A | 11/2012 |
| JP | 2017-142303 A | 8/2017 |
| KR | 2005-0073956 A | 7/2005 |
| KR | 2015-0067307 A | 6/2015 |
| TW | 200534345 | 10/2005 |
| WO | WO-2014/034617 | 3/2014 |
| WO | WO-2014/069316 | 5/2014 |
| WO | WO-2014/142183 | 9/2014 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

International Search Report (Application No. PCT/IB2017/054713) dated Oct. 31, 2017.

Written Opinion (Application No. PCT/IB2017/054713) dated Oct. 31, 2017.

\* cited by examiner

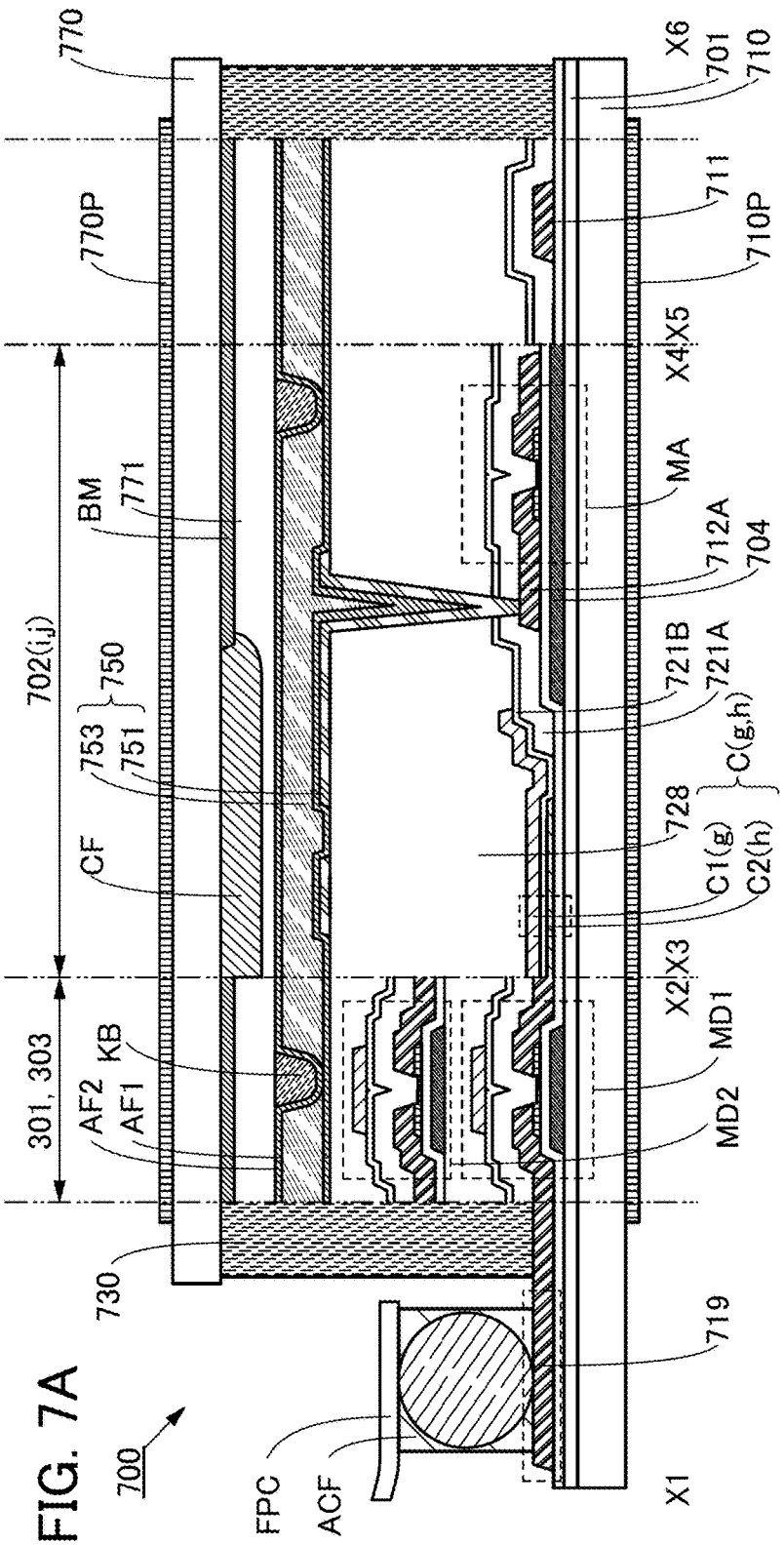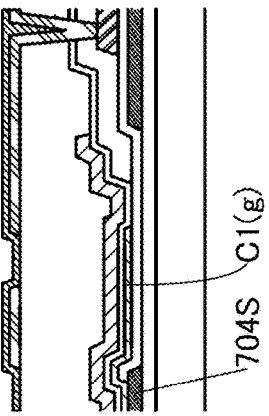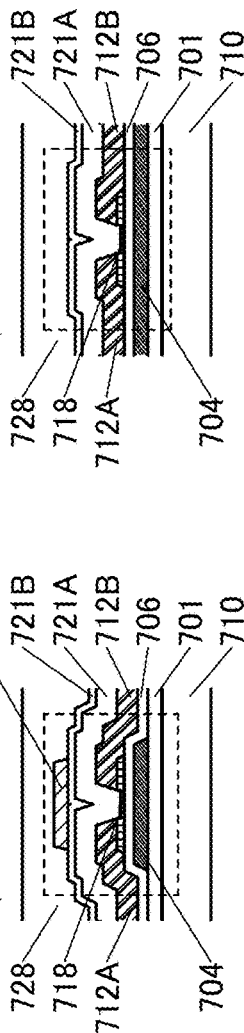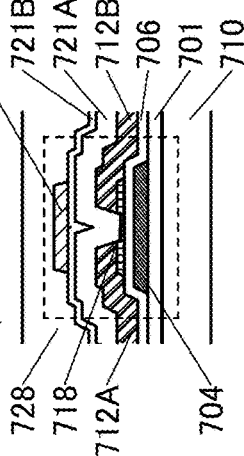

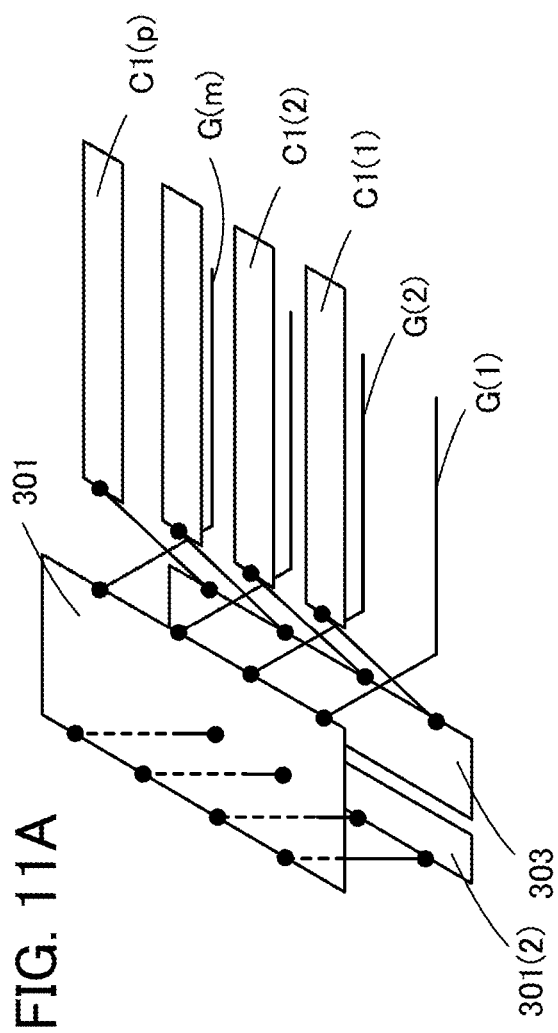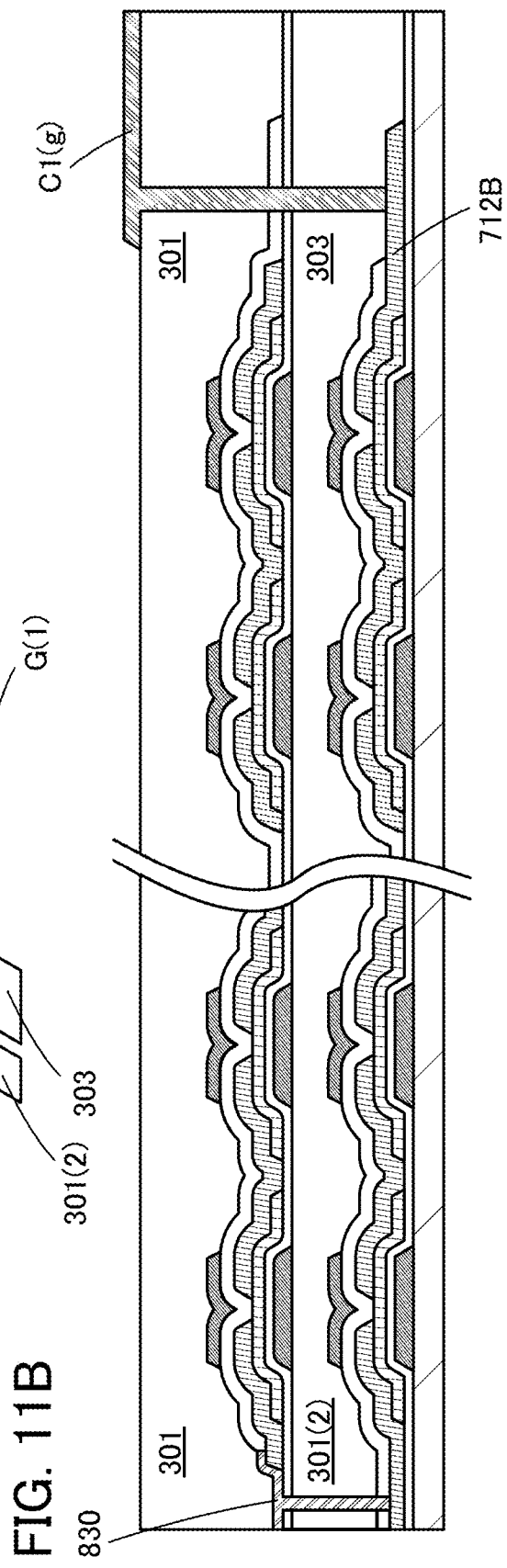

DISPLAY DEVICE AND ELECTRONIC APPLIANCE

CROSS-REFERENCE TO RELATED APPLICATIONS

This application is a continuation of U.S. application Ser. No. 16/325,226, filed Feb. 13, 2019, now allowed, which is incorporated by reference and is a U.S. national phase application of International Application No. PCT/IB2017/054713, filed Aug. 2, 2017, which claims the benefit of a foreign priority application filed in Japan as Application No. 2016-159846, on Aug. 17, 2016.

TECHNICAL FIELD

The present invention relates to an object, a method, or a manufacturing method. In particular, one embodiment of the present invention relates to a semiconductor device, a light-emitting device, a display device, an electronic appliance, a lighting device, a driving method thereof, or a manufacturing method thereof. Alternatively, it relates to an electronic appliance, a light-emitting device, or a lighting device that includes a display device, or a manufacturing method thereof.

Note that in this specification and the like, a semiconductor device generally refers to a device that can function by utilizing semiconductor characteristics. A transistor, a semiconductor circuit, an arithmetic device, a memory device, and the like are embodiments of the semiconductor device. Moreover, a light-emitting device, a display device, an electronic appliance, a lighting device, and an electronic appliance include a semiconductor device in some cases.

BACKGROUND ART

High-resolution panels used for high-end smartphones and the like are required to have a narrow frame to improve impression of the appearance. For example, a method of narrowing the width of a frame by placing a common driver circuit for a touch sensor and a gate driver circuit on both sides on the long sides of a panel in a high-resolution liquid crystal display device (LCD) having a built-in in-cell touch panel and using LTPS (Low Temperature Poly-Silicon) in a backplane has been studied (Patent Document 1).

However, further increase in the resolution of an LCD with a built-in in-cell touch panel increases the number of gate lines and accordingly increases the number of shift registers and buffers inside a gate driver, which causes a problem in that the operating frequency of the gate driver is increased. Furthermore, the layout area of the gate driver is increased, and it becomes difficult to achieve a narrow frame.

PRIOR ART DOCUMENT

Patent Document

[Patent Document 1] Japanese Published Patent Application No. 2003-152191

SUMMARY OF THE INVENTION

Problems to be Solved by the Invention

In view of this, an object of one embodiment of the present invention is to provide a display device with a narrow frame. Another object is to provide a display device with high visibility. Another object is to provide a display device with low power consumption. Another object is to provide a novel display device. Another object is to provide an electronic appliance including the above display device (display panel). Another object is to provide a novel electronic appliance.

Note that the description of these objects does not preclude the existence of other objects. In one embodiment of the present invention, there is no need to achieve all these objects. Objects other than the above will be apparent from the description of the specification and the like, and objects other than the above can be derived from the description of the specification and the like.

Means for Solving the Problems

One embodiment of the present invention is a display device including a first driver circuit and a first wiring over a first substrate; an insulating film over the first driver circuit; and a second driver circuit and a second wiring over the insulating film, in which the first driver circuit includes a first transistor, the second driver circuit includes a second transistor, one of a source and a drain of the first transistor is electrically connected to the first wiring, one of a source and a drain of the second transistor is electrically connected to the second wiring, a channel formation region of the second transistor includes a metal oxide, the first driver circuit and the second driver circuit at least partly overlap with each other in a direction perpendicular to a surface of the first substrate, the first driver circuit forms a gate driver, and the second driver circuit forms a common driver.

A channel formation region of the first transistor may include a metal oxide.

Another embodiment of the present invention is a display device including a first driver circuit and a first wiring over a first substrate; an insulating film over the first driver circuit; and a second driver circuit, a third driver circuit, and a second wiring over the insulating film, in which the first driver circuit includes a first transistor, the second driver circuit includes a second transistor, the third driver circuit includes a third transistor, one of a source and a drain of the first transistor is electrically connected to the first wiring, one of a source and a drain of the second transistor is electrically connected to the second wiring, a channel formation region of the second transistor includes a metal oxide, the first driver circuit and the second driver circuit at least partly overlap with each other in a direction perpendicular to a surface of the first substrate, the first driver circuit and the third driver circuit at least partly overlap with each other in the direction perpendicular to the surface of the first substrate, the first driver circuit and the third driver circuit form a gate driver, and the second driver circuit forms a common driver.

A channel formation region of each of the first transistor and the third transistor may include a metal oxide.

The area of the first driver circuit is larger than the area of the second driver circuit and the third driver circuit.

Another embodiment of the present invention is a display device including a first driver circuit and a first wiring over a first substrate; an insulating film over the first driver circuit; and a second driver circuit and a second wiring over the insulating film, in which the first driver circuit includes a first transistor, the second driver circuit includes a second transistor, one of a source and a drain of the first transistor is electrically connected to the second wiring, one of a source and a drain of the second transistor is electrically connected to the first wiring, a channel formation region of the first transistor includes a metal oxide, the first driver circuit and the second driver circuit at least partly overlap with each other in a direction perpendicular to a surface of the first substrate, the first driver circuit forms a common driver, and the second driver circuit forms a gate driver.

A channel formation region of the second transistor may include a metal oxide.

Another embodiment of the present invention is a display device including a first driver circuit, a third driver circuit, and a first wiring over a first substrate; an insulating film over the first driver circuit and the third driver circuit; and a second driver circuit and a second wiring over the insulating film, in which the first driver circuit includes a first transistor, the second driver circuit includes a second transistor, the third driver circuit includes a third transistor, one of a source and a drain of the first transistor is electrically connected to the second wiring, one of a source and a drain of the second transistor is electrically connected to the first wiring, a channel formation region of the first transistor includes a metal oxide, the first driver circuit and the second driver circuit at least partly overlap with each other in a direction perpendicular to a surface of the first substrate, the second driver circuit and the third driver circuit at least partly overlap with each other in the direction perpendicular to the surface of the first substrate, the first driver circuit forms a common driver, and the second driver circuit and the third driver circuit form a gate driver.

A channel formation region of each of the second transistor and the third transistor may include a metal oxide.

The area of the second driver circuit is larger than the area of the first driver circuit and the third driver circuit.

The first transistor and the second transistor may at least partly overlap with each other in the direction perpendicular to the surface of the first substrate.

The first wiring is a gate line, and the second wiring is a common line.

The first transistor includes a first gate electrode, a first gate insulating layer over the first gate electrode, a semiconductor layer over the first gate insulating layer, the source and the drain electrically connected to the semiconductor layer, a second gate insulating layer over the source and the drain, and a second gate electrode over the second gate insulating layer. A bottom surface of one of the source and the drain is in contact with a top surface of the gate line.

The second transistor includes a first gate electrode, a first gate insulating layer over the first gate electrode, a semiconductor layer over the first gate insulating layer, the source and the drain electrically connected to the semiconductor layer, a second gate insulating layer over the source and the drain, and a second gate electrode over the second gate insulating layer. A top surface of one of the source and the drain is in contact with a bottom surface of the common line.

Note that in this specification, a module in which a connector such as an FPC (Flexible printed circuit) or a TCP (Tape Carrier Package) is attached to a display device (display panel), a module in which a printed wiring board is provided at the end of a TCP, or a module in which an IC (integrated circuit) is directly mounted by a COG (Chip On Glass) method on a substrate where a display element is formed includes a display device in some cases.

Effect of the Invention

With the use of one embodiment of the present invention, a display device with a narrow frame can be provided. Alternatively, a display device including a driver circuit having a stack structure can be provided. Alternatively, a display device in which a gate driver and a common driver are stacked can be provided. Alternatively, a display device with high visibility can be provided. Alternatively, a display device with low power consumption can be provided. Alternatively, a novel display device can be provided. Alternatively, an electronic appliance including the above display device (display panel) can be provided. Alternatively, a novel electronic appliance can be provided.

Note that the description of these effects does not preclude the existence of other effects. Note that one embodiment of the present invention does not necessarily have all these effects. Note that effects other than these will be apparent from the description of the specification, the drawings, the claims, and the like, and effects other than these can be derived from the description of the specification, the drawings, the claims, and the like.

BRIEF DESCRIPTION OF DRAWINGS

FIGS. 7A to 7D are cross-sectional views illustrating a display device.

FIGS. 11A to 11B are a schematic view and a cross-sectional schematic view illustrating a driver circuit portion.

MODE FOR CARRYING OUT THE INVENTION

Figure 1A:
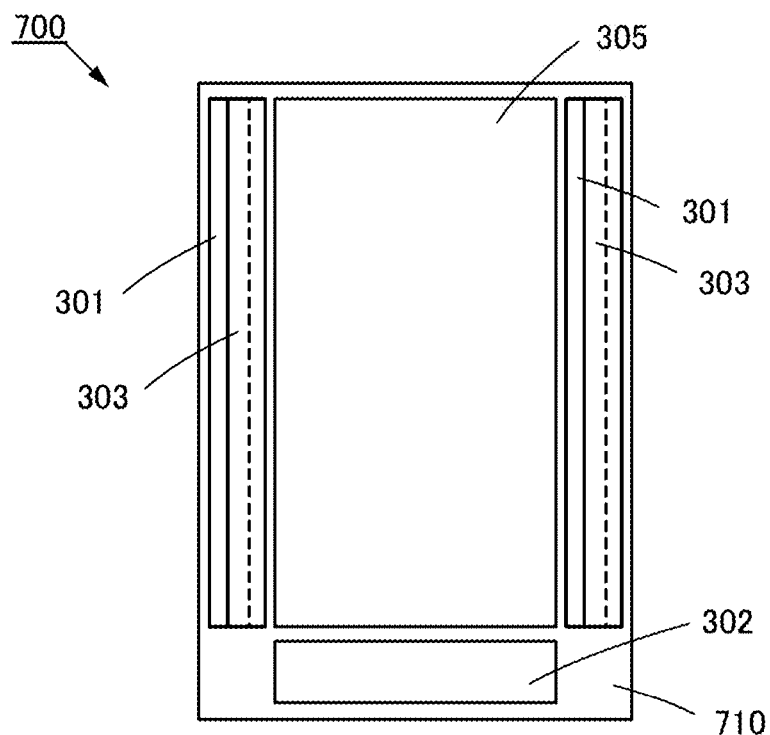
FIGS. 1A to 1B are diagrams illustrating a display device.

Embodiments will be described below with reference to the drawings. Note that embodiments can be carried out in many different modes, and it is easily understood by those skilled in the art that the modes and the details can be modified in various ways without departing from the spirit and the scope. Thus, the present invention should not be interpreted as being limited to the following description of the embodiments.

In the drawings, the size, the layer thickness, or the region is exaggerated for clarity in some cases, and therefore is not limited to the illustrated scale. Note that the drawings schematically show ideal examples, and embodiments are not limited to shapes, values, or the like shown in the drawings.

Note that ordinal numbers "first", "second", and "third" used in this specification are given in order to avoid confusion among components, and do not limit the components numerically.

In this specification, terms for describing arrangement, such as "over" and "under", are used for convenience in describing a positional relation between components with reference to drawings. Furthermore, the positional relation between components is changed as appropriate in accordance with the direction in which each component is described. Thus, the positional relation is not limited to that described with a term used in this specification, and can be explained in different words as appropriate depending on the situation.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the drain, the channel formation region, and the source. Note that in this specification and the like, a channel formation region refers to a region through which current mainly flows.

Furthermore, functions of a source and a drain may be switched when a transistor of opposite polarity is employed or when the direction of current flow is changed in circuit operation, for example. Therefore, the terms "source" and "drain" can be used interchangeably in this specification and the like.

Note that in this specification and the like, "electrically connected" includes connection through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. Moreover, "perpendicular" indicates a state where two straight lines are placed at an angle of greater than or equal to 80° and less than or equal to 100°. Thus, the case where the angle is greater than or equal to 85° and less than or equal to 95° is also included.

In this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

Unless otherwise specified, an off-state current in this specification and the like refers to a drain current of a transistor in an off state (also referred to as a non-conducting state and a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to a drain current at the time when the voltage Vgs between its gate and source is lower than the threshold voltage Vth.

Furthermore, in this specification and the like, the off-state current of a transistor with a channel width W is sometimes represented by the value of flowing current per channel width W. Alternatively, it is represented by the value of flowing current per given channel width (e.g., 1 µm). In the latter case, the off-state current is sometimes expressed in the unit with the dimension of current/length (e.g., A/µm).

In this specification and the like, a metal oxide means an oxide of a metal in a broad sense. Metal oxides are classified into an oxide insulator, an oxide conductor (including a transparent oxide conductor), an oxide semiconductor (or also simply referred to as an OS), and the like. For example, in the case where a metal oxide is used in a semiconductor layer of a transistor, the metal oxide is called an oxide semiconductor in some cases. That is to say, in the case where a metal oxide has at least one of an amplifying function, a rectifying function, and a switching function, the metal oxide can be referred to as a metal oxide semiconductor, or an OS for short. Furthermore, in the case where an OS FET is stated, it can refer to a transistor containing a metal oxide or an oxide semiconductor.

In this specification and the like, metal oxides containing nitrogen are also collectively referred to as a metal oxide in some cases. Moreover, a metal oxide containing nitrogen may be called a metal oxynitride.

In this specification and the like, CAAC (c-axis aligned crystal) and CAC (cloud aligned complementary) may be stated. Note that CAAC refers to an example of a crystal structure, and CAC refers to an example of a function or a material composition.

In this specification and the like, a CAC-OS or a CAC-metal oxide has a conducting function in part of the material and an insulating function in another part of the material, and has a function of a semiconductor as the whole material. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of these functions can maximize each function.

In this specification and the like, the CAC-OS or the CAC-metal oxide includes conductive regions and insulating regions. The conductive regions have the aforementioned conducting function, and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different bandgaps. For example, the CAC-OS or the CAC-metal oxide is composed of a component having a wide gap due to the insulating region and a component having a narrow gap due to the conductive region. When carriers flow in this composition, carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

In this specification and the like, a gate line is a conductive film and is electrically connected to gates of a plurality of transistors included in an electronic appliance such as a display device, for example. A common line is a conductive film and is electrically connected to one electrode of each of a plurality of display elements included in an electronic appliance such as a display device, for example. A gate driver is a circuit having a function of supplying a voltage to the gate line. A common driver is a circuit having a function of supplying a voltage to the common line.

Embodiment 1

In this embodiment, a structure of a display device of one embodiment of the present invention will be described with reference to FIG. 1 to FIG. 10.

FIG. 1(A) is a schematic view of a display device 700 seen from the above. The display device 700 includes a display region 305 over a substrate 710, and gate drivers 301, a source driver 302, and common drivers 303 are placed around the display region.

Note that the gate driver 301 and the common driver 303 are placed to be stacked up, and the gate driver 301 and at least part of the common driver 303 overlap with each other. FIG. 1(A) shows an example where the gate driver 301 is formed on the side closer to the substrate 710 than the common driver 303 is.

Figure 1B:
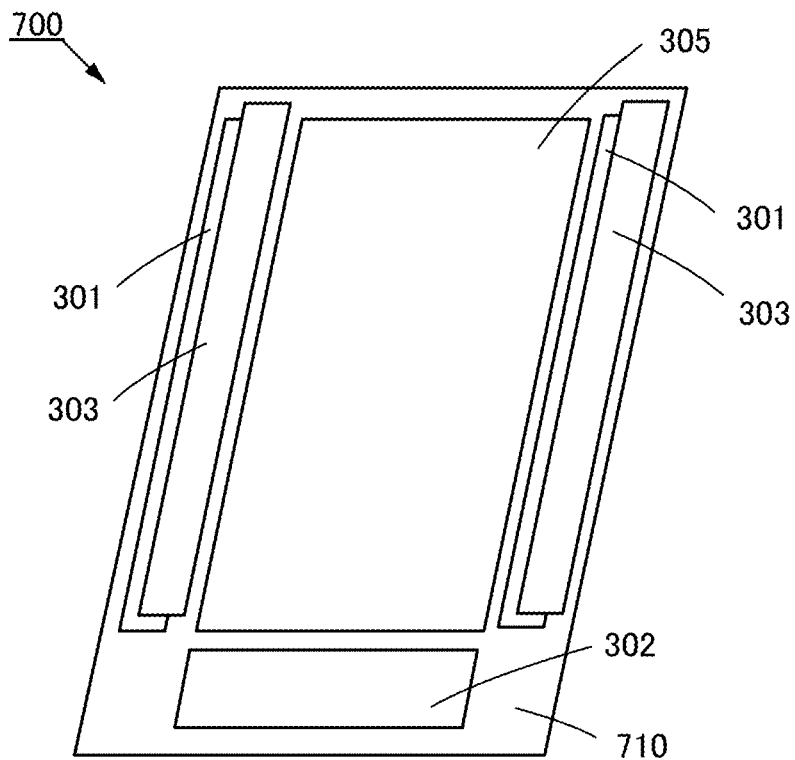

FIG. 1(B) is a schematic view obtained by seeing FIG. 1(A) obliquely from the above. As in FIG. 1(A), the gate driver 301 is formed on the side closer to the substrate 710 than the common driver 303 is.

Stacking the gate driver 301 and the common driver 303 as illustrated in FIG. 1(A) and FIG. 1(B) can reduce the area occupied by the driver circuits in the display device 700 and can achieve a narrower frame.

Figure 2A:
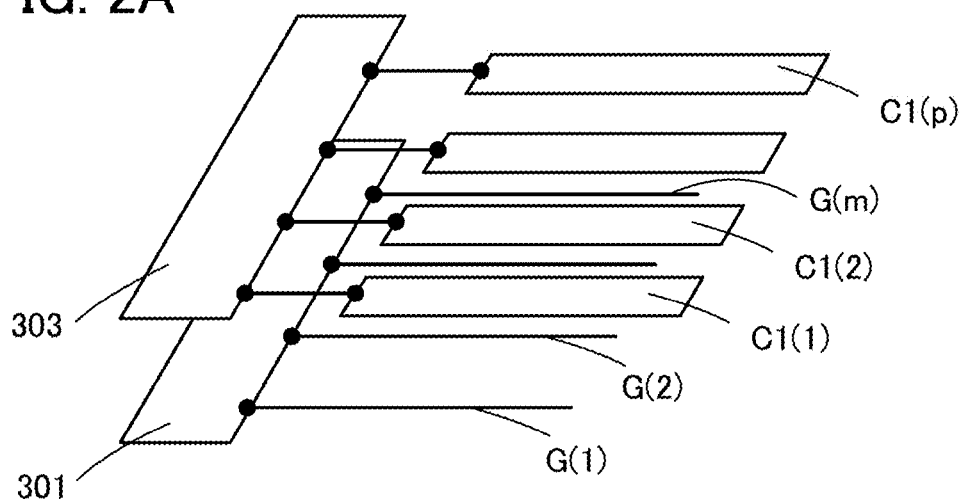
FIGS. 2A to 2B are a schematic view and a cross-sectional schematic view illustrating a driver circuit portion.

FIG. 2(A) is a schematic view illustrating a positional relation between the gate driver 301 and the common driver 303. The gate driver 301 is electrically connected to first wirings G(1) to G(m), and the common driver 303 is electrically connected to first conductive films C1(1) to C1(p).

As in FIG. 1(A) and FIG. 1(B), the gate driver 301 and the common driver 303 are stacked, and additionally, the first wirings G(1) to G(m) and the first conductive films C1(1) to C1(p) are also stacked.

Figure 2B:
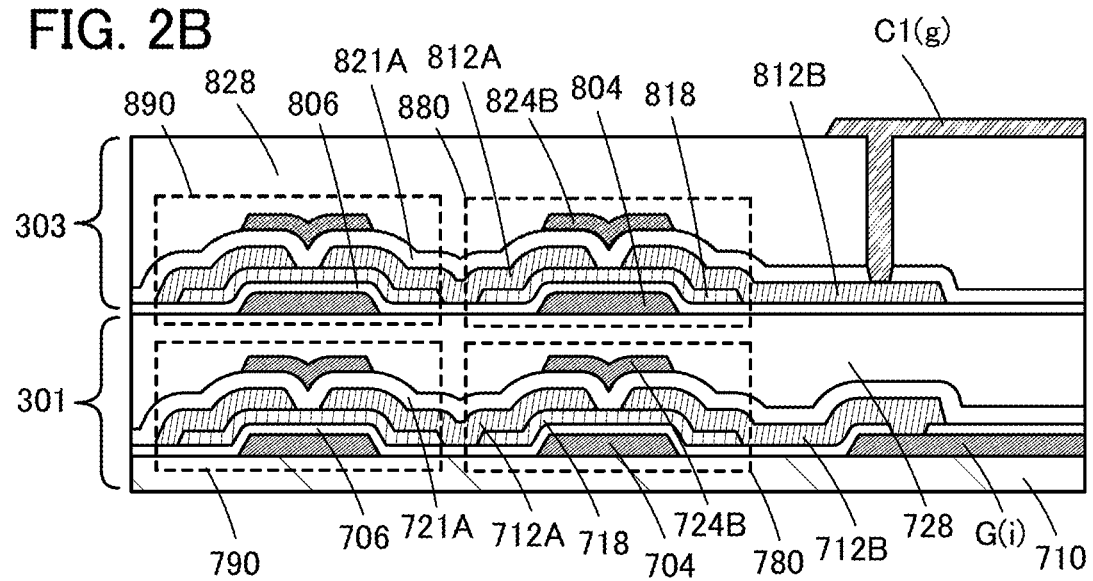

FIG. 2(B) is a cross-sectional schematic view illustrating a positional relation between the gate driver 301 and the common driver 303. The gate driver 301 includes a first transistor 780, and the common driver 303 includes a second transistor 880.

The first transistor 780 includes a conductive film 704 over the substrate 710, an insulating film 706 over the conductive film 704, a semiconductor film 718 over the insulating film 706, a conductive film 712A and a conductive film 712B over the semiconductor film 718, an insulating film 721A over the conductive film 712A and the conductive film 712B, and a conductive film 724B over the insulating film 721A.

Here, the conductive film 704 functions as a first gate electrode; the insulating film 706 functions as a first gate insulating layer; the semiconductor film 718 functions as a semiconductor layer in which a channel can be formed; the conductive film 712A functions as one of a source electrode and a drain electrode; the conductive film 712B functions as the other of the source electrode and the drain electrode; the insulating film 721A functions as a second gate insulating layer; and the conductive film 724B functions as a second gate electrode.

The conductive film 712B of the first transistor 780 is electrically connected to the first wiring G(i). Note that the first wiring G(i) is formed in the same process as the conductive film 704. Moreover, the first wiring G(i) functions as a gate line.

The second transistor 880 includes a conductive film 804 over an insulating film 728, an insulating film 806 over the conductive film 804, a semiconductor film 818 over the insulating film 806, a conductive film 812A and a conductive film 812B over the semiconductor film 818, an insulating film 821A over the conductive film 812A and the conductive film 812B, and a conductive film 824B over the insulating film 821A.

Here, the conductive film 804 functions as a first gate electrode; the insulating film 806 functions as a first gate insulating layer; the semiconductor film 818 functions as a semiconductor layer in which a channel can be formed; the conductive film 812A functions as one of a source electrode and a drain electrode; the conductive film 812B functions as the other of the source electrode and the drain electrode; the insulating film 821A functions as a second gate insulating layer; and the conductive film 824B functions as a second gate electrode.

The conductive film 812B of the second transistor 880 is electrically connected to the first conductive film $C1(g)$. Note that a structure where the first conductive film $C1(g)$ is in direct contact with the conductive film 812B is employed in FIG. 2(B); alternatively, a structure where these are electrically connected through another conductor can be employed.

Moreover, the first transistor 780 and the second transistor 880 are configured to overlap with each other completely in FIG. 2(B); however, such a structure is not always necessary and for example, the first transistor 780 and the second transistor 880 can be configured to overlap with each other partly.

The gate driver 301 may include a third transistor 790 that is connected in series with the first transistor 780. The common driver 303 may include a fourth transistor 890 that is connected in series with the second transistor 880.

The structures of the first transistor 780, the second transistor 880, the third transistor 790, and the fourth transistor 890 are not limited to those shown in FIG. 2(B). For example, as the structures of the first to fourth transistors, the structure of a transistor 100 or the structure of a transistor MD1 that will be described later can be used.

Stacking the gate driver 301 and the common driver 303 as described above can reduce the area occupied by the driver circuits in the display device 700 and can achieve a narrower frame.

Figure 3A:
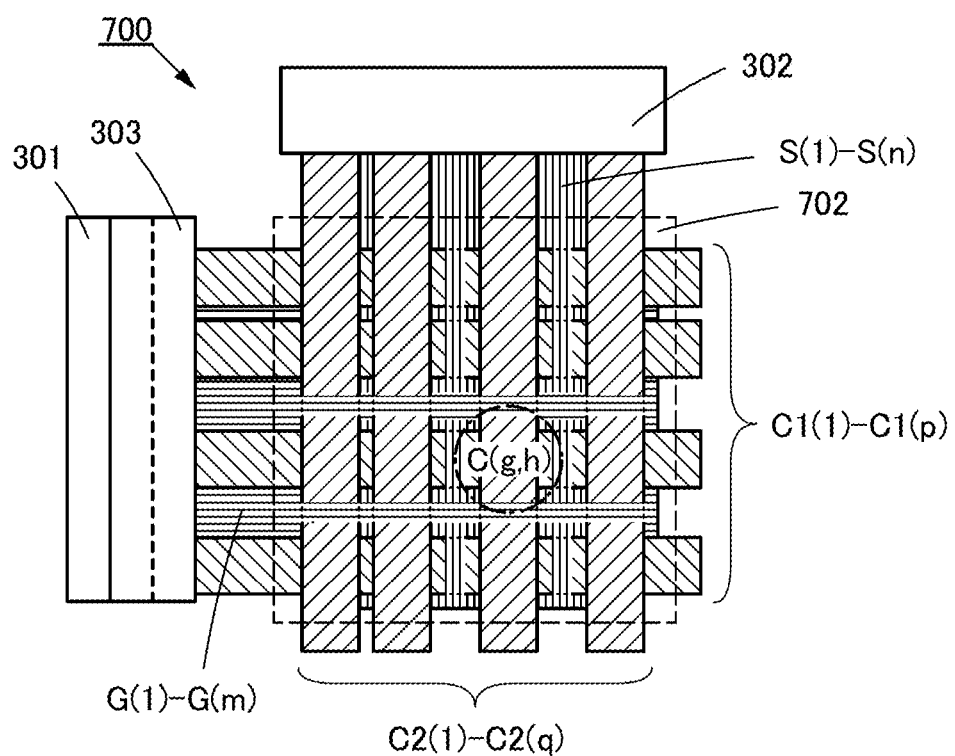
FIGS. 3A to 3B are diagrams illustrating a display device and a sensor.
Figure 3B:
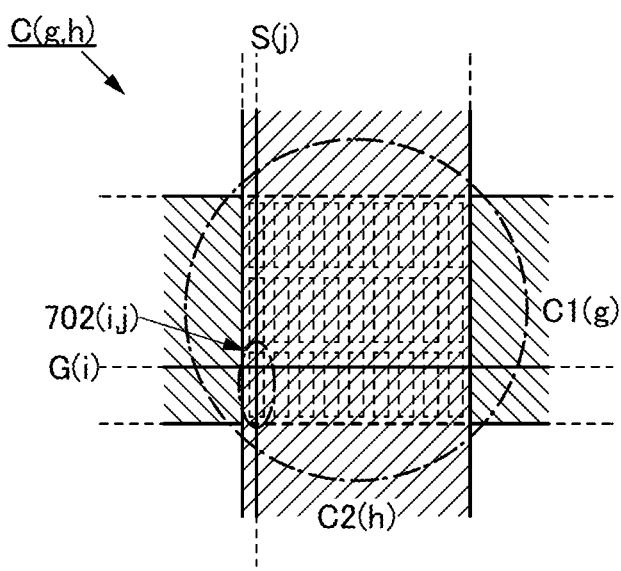

FIG. 3 is a diagram illustrating the structure of the display device 700 of one embodiment of the present invention. FIG. 3(A) is a block diagram illustrating the structure of the display device 700 of one embodiment of the present invention. FIG. 3(B) is a schematic view illustrating the arrangement of a sensor C(g,h) shown in FIG. 3(A) and a pixel 702($i,j$) overlapping with the sensor C(g,h).

Figure 4A:
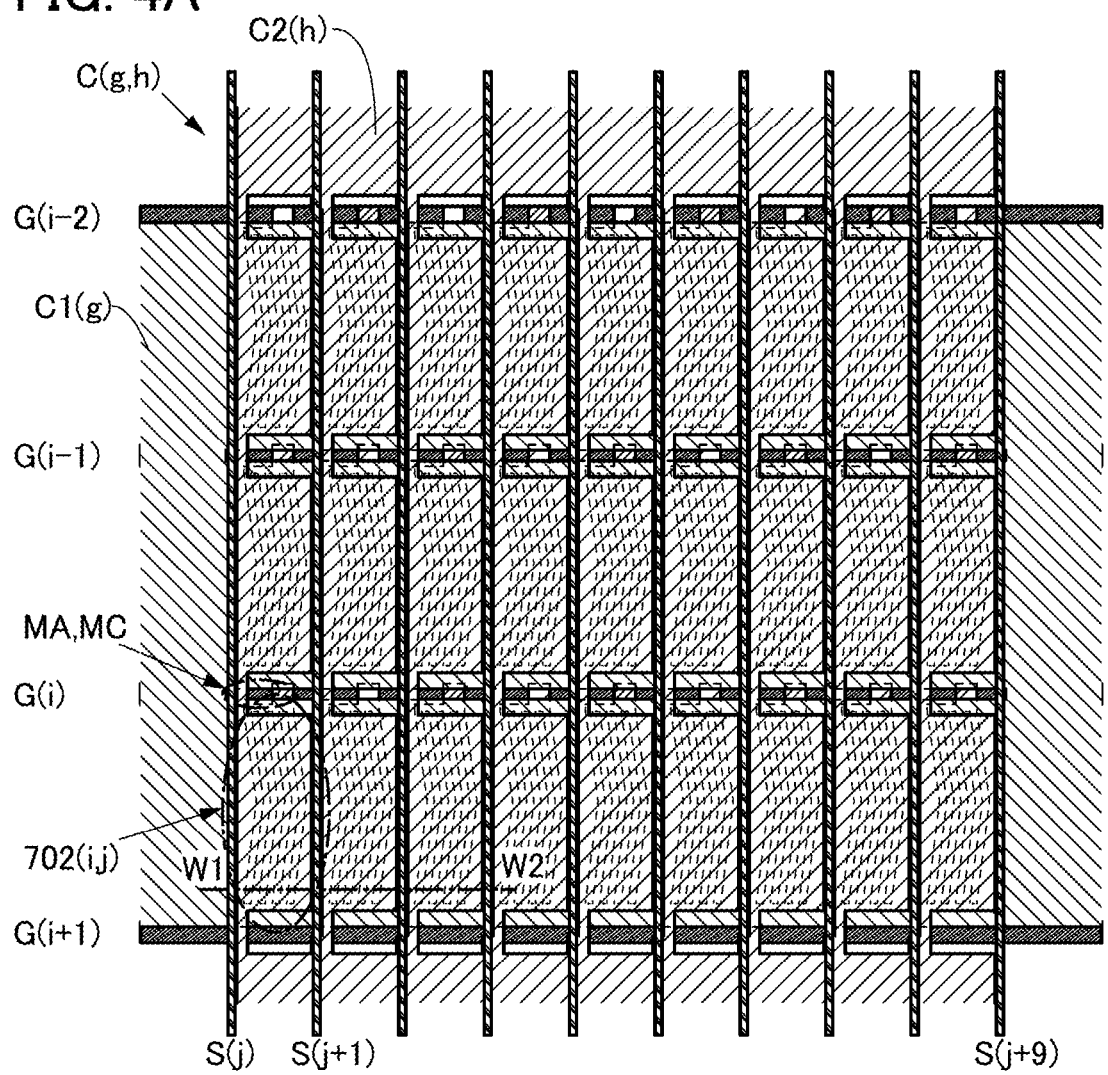
FIGS. 4A to 4B are a top view and a cross-sectional view illustrating a display device.
Figure 4B:
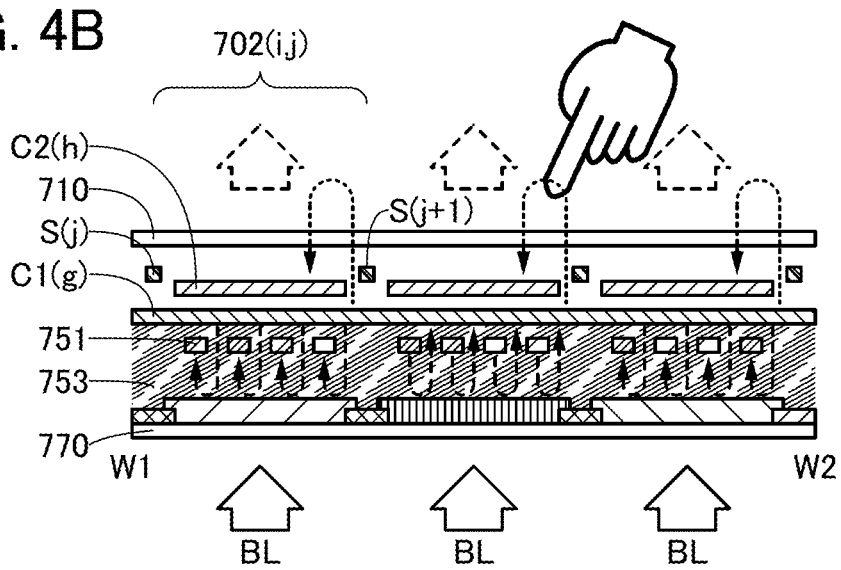

FIG. 4 is a diagram illustrating the structure of the sensor C(g,h) in the display device 700 of one embodiment of the present invention, which is illustrated in FIG. 3. FIG. 4(A) is a top view of the sensor C(g,h) of one embodiment of the present invention. FIG. 4(B) is a cross-sectional view of the sensor C(g,h) and the pixel 702(i,j) along the section line W1-W2 shown in FIG. 4(A).

Figure 5A:
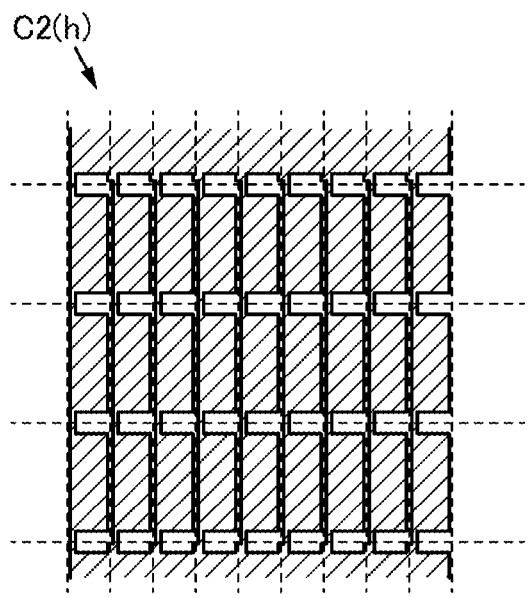
FIGS. 5A to 5C are diagrams illustrating a structure of a sensor.
Figure 5B:
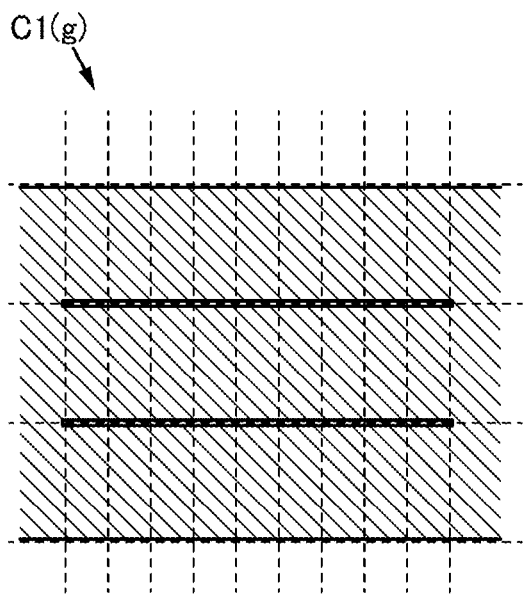
Figure 5C:
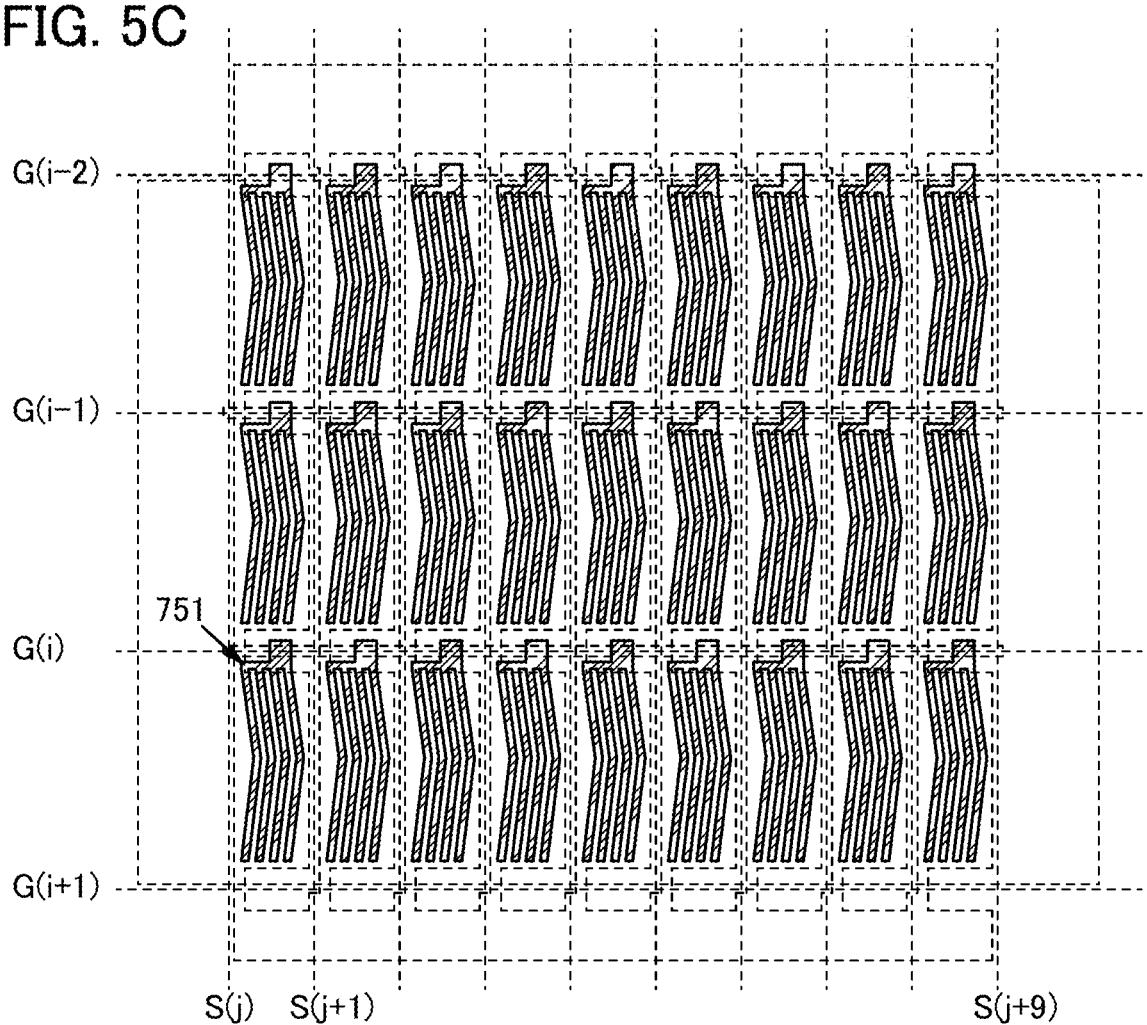

FIG. 5 is a diagram illustrating the structure of the sensor C(g,h) in the display device 700 of one embodiment of the present invention. FIG. 5(A) is a top view of a second conductive film C2(h) of the sensor C(g,h). FIG. 5(B) is a top view of the first conductive film C1(g) of the sensor C(g,h). FIG. 5(C) is a top view of a third conductive film 751 in the display device 700 of one embodiment of the present invention.

Figure 6A:
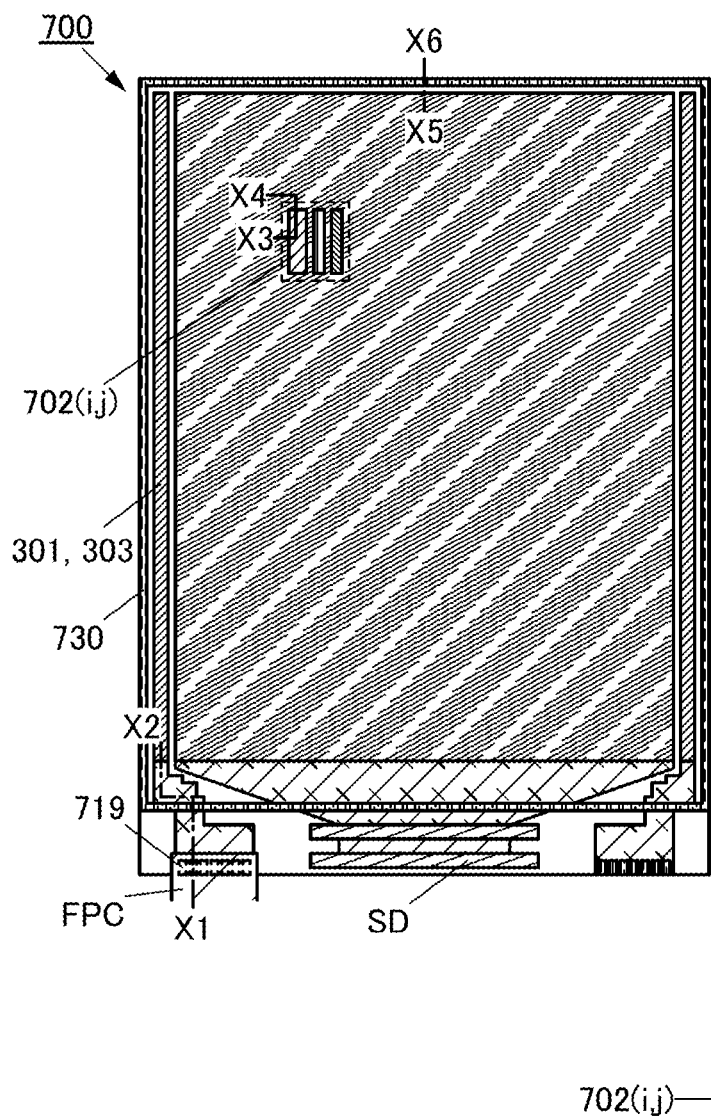
FIGS. 6A to 6B are diagrams illustrating a display device.
Figure 6B:
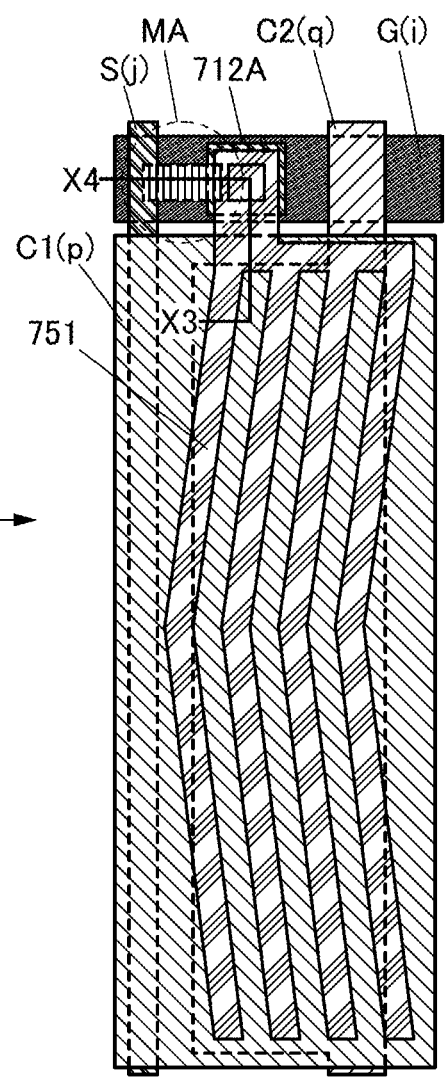

FIG. 6 is a diagram illustrating the structure of the display device 700 of one embodiment of the present invention. FIG. 6(A) is a top view of part of the display device 700 of one embodiment of the present invention. FIG. 6(B) is a top view of part of the pixel 702(i,j) in the display device 700 of one embodiment of the present invention.

FIG. 7 is a diagram illustrating the structure of the display device 700 of one embodiment of the present invention. FIG. 7(A) is a cross-sectional view of the display device 700 of one embodiment of the present invention along the section lines X1-X2, X3-X4, and X5-X6 shown in FIG. 6(A). FIG. 7(B) is a cross-sectional view illustrating the details of the transistor MD1 shown in FIG. 7(A). FIG. 7(C) is a cross-sectional view illustrating the details of a transistor MA shown in FIG. 7(A). FIG. 7(D) is a cross-sectional view illustrating a variation example of part of the structure shown in FIG. 7(A).

Note that in this specification, g and i used to indicate the positions of the sensor, the conductive film, the pixel, and the like each represent an integer of 1 or more and p or less, and h and j each represent an integer of 1 or more and q or less. For example, the pixel 702(i,j) indicates the pixel positioned at the i-th row and the j-th column among pixels 702 arranged in a matrix of 1 to p pixels in the row direction and 1 to q pixels in the column direction.

<Structure Example of Display Device 700>

The display device 700 described in this embodiment includes the substrate 710, the pixel 702(i,j), a display element 750, and the sensor C(g,h) (see FIG. 7).

The substrate 710 has a light-transmitting property. The display element 750 includes a region overlapping with the substrate 710. The sensor C(g,h) is provided between the display element 750 and the substrate 710.

The pixel 702(0 includes the display element 750.

The display element 750 has a function of performing display on the side on which the substrate 710 is positioned. For example, display can be performed by providing a backlight on a substrate 770 side so as to emit light BL that travels through the substrate 770 toward the substrate 710 (see FIG. 4(B)).

The sensor C(g,h) has a function of sensing an object that approaches or touches the side on which the substrate 710 is positioned (see FIG. 4(B)).

The sensor C(g,h) includes the first conductive film C1(g), the second conductive film C2(h) between the first conductive film C1(g) and the substrate 710, and an insulating film 721B between the first conductive film C1(g) and the second conductive film C2(h).

The display element 750 of the display device 700 includes a layer 753 containing a liquid crystal material and the third conductive film 751 provided so that an electric field controlling the alignment of the liquid crystal material contained in the layer 753 containing the liquid crystal material can be applied between the first conductive film C1(g) and the third conductive film 751.

The display device 700 described in this embodiment is configured to include the sensor C(g,h) including the first conductive film C1(g) and the second conductive film C2(h), and the display element 750 including the layer 753 containing the liquid crystal material and the third conductive film 751 which is provided so that an electric field controlling the alignment of the liquid crystal material contained in the layer 753 containing the liquid crystal material can be applied between the first conductive film C1(g) and the third conductive film 751. Thus, the conductive film included in the sensor can be used for the display element. As a result, a novel display device that is highly convenient or reliable can be provided.

In addition, the display device 700 includes the transistor MA electrically connected to the display element 750. The third conductive film 751 is electrically connected to a source electrode or a drain electrode of the transistor MA.

The transistor MA of the display device 700 includes the semiconductor film 718. The insulating film 721B includes a region that is sandwiched between the layer 753 containing the liquid crystal material and the semiconductor film 718 (see FIG. 7(C)).

Furthermore, the display device 700 includes the gate line G(i) electrically connected to the transistor MA, a signal line S(j) electrically connected to the transistor MA, a plurality of transistors electrically connected to the gate line G(i), and a plurality of transistors electrically connected to the signal line S(j) (see FIG. 4(A)). Specifically, the conductive film 704 functioning as a gate electrode of the transistor MA is electrically connected to the gate line G(i), and the conductive film 712B functioning as the source electrode or the drain electrode is electrically connected to the signal line S(j) (see FIG. 7(C)).

The first conductive film C1(g) or the second conductive film C2(h) has an opening overlapping with the gate line G(i) or the signal line S(j) (see FIG. 5(A) or FIG. 5(B)).

The display device 700 described in this embodiment includes the gate line G(i) electrically connected to transistors MA and the signal line S(j) electrically connected to the transistor, and is configured to include the first conductive film C1(g) or the second conductive film C2(h) that has the opening overlapping with the signal line S(j) or the gate line G(i). Thus, the area of a region overlapping with the gate line or the signal line can be reduced in the first conductive film or the second conductive film, and the parasitic capacitance of the gate line or the signal line can be reduced. As a result, a novel touch panel that is highly convenient or reliable can be provided.

The semiconductor film 718 of the display device 700 contains indium, gallium, zinc, and oxygen.

The second conductive film C2(h) of the display device 700 contains indium, gallium, zinc, and oxygen.

The display device 700 described in this embodiment is configured to include the transistor MA that includes the semiconductor film 718 containing indium, gallium, zinc, and oxygen and the sensor C(g,h) that includes the second conductive film C2(h) containing indium, gallium, zinc, and oxygen. Thus, the films containing indium, gallium, zinc, and oxygen can be formed in the same process. Moreover, the films that contain indium, gallium, zinc, and oxygen and are formed in the same process can be used as the semiconductor film or the second conductive film. As a result, a novel touch panel that is highly convenient or reliable can be provided.

In addition to the above components, the display device 700 can include the gate driver 301, the source driver 302, and the common driver 303 (see FIG. 3(A)).

The gate driver 301 is electrically connected to the gate lines G(1) to G(m) and has a function of supplying selection signals, for example. For example, the transistor MD1 can be used in the gate driver 301 (see FIG. 7(A)).

The source driver 302 is electrically connected to signal lines S(1) to S(n) and has a function of supplying image signals, for example. Moreover, the source driver 302 is electrically connected to second conductive films C2(1) to C2($q$) and has a function of sensing the potentials of the second conductive films C2(1) to C2($q$) that change in response to driving signals and capacitances and supplying sensor signals, for example.

The common driver 303 is electrically connected to the first conductive films C1(1) to C1($p$) and has a function of supplying driving signals including a rectangular wave or the like, for example. For example, a transistor MD2 can be used in the common driver 303 (see FIG. 7(A)).

Overlapping the common driver 303 and the gate driver 301 as illustrated in FIG. 3(A) and FIG. 7(A) can reduce the area of the driver circuit portion.

Note that in FIG. 3(A) and FIG. 3(B), m, n, p, and q are each an integer of 2 or more, g is an integer of 1 or more and p or less, and h is an integer of 1 or more and q or less.

The display device 700 can include sensors in a matrix of p rows and q columns. Note that the sensor C(g,h) includes the first conductive film C1($g$) in the g-th row and the second conductive film C2($h$) in the h-th column.

The display device 700 can include display elements in a matrix of m rows and n columns. Note that the pixel 702($i,j$) includes the display element 750. The pixel 702($i,j$) is electrically connected to the gate line G(i) in the i-th row and is electrically connected to the signal line S(j) in the j-th column.

The display device 700 can include a single or a plurality of pixels including a region overlapping with the sensor. For example, the display device 700 can include the pixel 702($i,j$) and other pixels overlapping with the sensor C(g,h) (see FIG. 3(B) and FIG. 4(B)).

The display device 700 can include a plurality of gate lines that are provided along the first conductive film C1($g$). For example, the display device 700 can include the gate line G(i−1) and the gate line G(i) that are provided along the first conductive film C1($g$) (see FIG. 4(A)). Note that another conductive film may be electrically connected to the first conductive film C1($g$). For example, a conductive film 704S may be connected to the first conductive film C1($g$) (see FIG. 7(D)). Thus, electric resistance can be reduced.

The display device 700 can include a plurality of signal lines that are provided along the second conductive film. For example, the display device 700 can include the signal lines S(j) to S(j+9) that are provided along the second conductive film C2($h$) (see FIG. 4(A)).

The display device 700 can include the first conductive film C1($g$) having an opening. For example, a conductive film having an opening that overlaps with the gate line G(i−1) and an opening that overlaps with the gate line G(i) can be used as the first conductive film C1($g$) (see FIG. 5(B)).

The display device 700 can include the second conductive film having an opening. For example, a conductive film having an opening that overlaps with the signal line S(j) to an opening that overlaps with the signal line (j+9) can be used as the second conductive film C2($h$) (see FIG. 5(A)).

The display device 700 can use the third conductive film 751 that is provided so as to apply an electric field travelling in a direction intersecting with the thickness direction of the layer 753 containing the liquid crystal material (also referred to as a horizontal electric field). For example, it is possible to use the comb-like third conductive film 751 including a region overlapping with the first conductive film C1($g$) (see FIG. 4(B) and FIG. 5(C)). Alternatively, it is possible to use the third conductive film 751 that is provided so as to apply an electric field travelling in the thickness direction of the layer 753 containing the liquid crystal material (also referred to as a vertical electric field).

Individual components included in the display device of one embodiment of the present invention will be described below. Note that in some cases, these components cannot be clearly distinguished from each other and one component may also serve as another component or include part of another component.

For example, the first conductive film C1($g$) is part of the display element 750 as well as part of the sensor C(g,h).

The display device 700 can include the substrate 770 that includes a region overlapping with the substrate 710 and a sealant 730 that has a function of bonding the substrate 710 and the substrate 770. Thus, the display element 750 can be provided in a region surrounded by the substrate 710, the substrate 770, and the sealant 730, for example.

The display device 700 can include a structure KB between the substrate 710 and the substrate 770. Thus, a predetermined space can be provided between the substrate 710 and the substrate 770.

The display device 700 can include a coloring film CF that has a region overlapping with the display element 750, and can also include a light-blocking film BM that has an opening in a region overlapping with the display element 750.

The display device 700 can include an insulating film 771 between the coloring film CF and the layer 753 containing the liquid crystal material, and can also include the insulating film 771 between the light-blocking film BM and the layer 753 containing the liquid crystal material. Thus, unevenness resulting from the thickness of the coloring film CF can be reduced, or impurities can be prevented from diffusing from the coloring film CF or the light-blocking film BM into the layer 753 containing the liquid crystal material.

The display device 700 can include an alignment film AF1 between the layer 753 containing the liquid crystal material and the substrate 710, and can also include an alignment film AF2 between the layer 753 containing the liquid crystal material and the substrate 770.

The display device 700 can include an optical film 710P or an optical film 770P. For example, the optical film 710P can be provided such that the substrate 710 is sandwiched between the layer 753 containing the liquid crystal material and the optical film 710P. Alternatively, the optical film 770P can be provided such that the substrate 770 is sandwiched between the layer 753 containing the liquid crystal material and the optical film 770P.

For example, polarizing plates can be used as the optical film 710P and the optical film 770P. Polarizing plates can be used so that one of polarization directions is a predetermined direction in relation to the other polarization direction. Specifically, two linear polarizing plates can be used and arranged in a crossed-Nicol state.

The display device 700 can include a conductive film 724 that has a region overlapping with the semiconductor film 718 of the transistor MD1. For example, a material that can be formed in the same process as the first conductive film C1(g) can be used for the conductive film 724 (see FIG. 7(B)).

The display device 700 can include an insulating film 701 between the transistor MA and the substrate 710. The display device 700 can include the insulating film 721B or the insulating film 728 between the layer 753 containing the liquid crystal material and the semiconductor film 718. The display device 700 can include the insulating film 721A between the insulating film 721B and the semiconductor film 718.

For example, the insulating film 701 has a function of suppressing impurity diffusion from the substrate 710 into the transistor MA, and the insulating film 721B or the insulating film 721A has a function of suppressing impurity diffusion into the semiconductor film 718.

For example, the insulating film 728 has a function of making a step due to the structure of the transistor MA or the like that overlaps with the insulating film 728 flat.

The display device 700 can include the insulating film 706 between the conductive film 704 and the semiconductor film 718. For example, the insulating film 706 functions as a gate insulating film.

The display device 700 can include a wiring 711 that is electrically connected to the display element 750 or the sensor C(g,h).

The display device 700 can include a terminal 719 that is electrically connected to the wiring 711. For example, a flexible printed circuit board FPC1 can be electrically connected to the terminal 719 using a conductive member ACF1.

<<Structure>>

The display device 700 includes the substrate 710, the display element 750, or the sensor C(g,h).

The display device 700 includes the first conductive film C1(g), the second conductive film C2(h), the insulating film 721B, the layer 753 containing the liquid crystal material, or the third conductive film 751.

The display device 700 includes the transistor MA, the semiconductor film 718, the gate line G(i), or the signal line S(j).

The display device 700 can also include a common driver, a gate driver, and a source driver.

<<Substrate 710>>

The substrate 710 is formed using a material that has heat resistance high enough to withstand heat treatment in the manufacturing process, and a glass substrate can be used, for example.

Specifically, non-alkali glass, soda-lime glass, potash glass, crystal glass, quartz, sapphire, or the like can be used for the substrate 710. Moreover, a metal substrate of SUS, aluminum, or the like; a single crystal semiconductor substrate or a polycrystalline semiconductor substrate made of silicon or silicon carbide; a compound semiconductor substrate of silicon germanium or the like; an SOI substrate; or the like can be used as the substrate 710.

Additionally, a resin film or a resin plate using polyester, polyolefin, polyamide, polyimide, polycarbonate, acrylic, or the like may be used as the substrate 710.

<<Substrate 770>>

For the substrate 770, a material that can be used for the substrate 710 can be used.

<<Conductive Film 704, Conductive Film 712A, Conductive Film 712B, Wiring 711, Terminal 719>>

A conductive material can be used for the conductive film 704, the conductive film 712A, the conductive film 712B, the wiring 711, or the terminal 719.

For example, an inorganic conductive material, an organic conductive material, a metal, conductive ceramics, or the like can be used for the conductive film 704, the conductive film 712A, the conductive film 712B, the wiring 711, or the terminal 719.

Specifically, a metal element selected from aluminum, gold, platinum, silver, copper, chromium, tantalum, titanium, molybdenum, tungsten, nickel, iron, cobalt, palladium, and manganese, or the like can be used for the conductive film 704, the conductive film 712A, the conductive film 712B, the wiring 711, or the terminal 719. Alternatively, an alloy containing the above-described metal element, or the like can be used for the conductive film 704, the conductive film 712A, the conductive film 712B, the wiring 711, or the terminal 719. In particular, an alloy of copper and manganese is suitable for microfabrication using a wet etching method.

Furthermore, a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film is formed, an aluminum film is stacked over the titanium film, and additionally, a titanium film is formed thereover; or the like can be used for the conductive film 704, the conductive film 712A, the conductive film 712B, the wiring 711, or the terminal 719.

Additionally, a film containing a conductive oxide such as indium oxide, indium tin oxide, indium zinc oxide, zinc oxide, or zinc oxide to which gallium is added, graphene, or graphite, or the like can be used for the conductive film 704, the conductive film 712A, the conductive film 712B, the wiring 711, or the terminal 719.

<<Gate Line G(i), Signal Line S(j)>>

A conductive material can be used for the gate line G(i) or the signal line S(j). For example, a material that can be used for the wiring 711 can be used for the gate line G(i) or the signal line S(j).

<<Sensor C(g,h)>>

The sensor C(g,h) has a function of sensing capacitance, illuminance, magnetic force, radio waves, pressure, or the like and supplying a signal based on the sensed physical quantity.

For example, a capacitor, a photoelectric conversion element, a magnetic sensor, a piezoelectric element, a resonator, or the like can be used as the sensor C(g,h).

For example, a sensor having a function of supplying a signal that changes with a change in capacitance can be used as the sensor C(g,h). Specifically, a mutual capacitive sensor or a self-capacitive sensor can be used.

For example, a capacitor including the first conductive film C1(g) and the second conductive film C2(h) can be used as the sensor C(g,h).

When an object having a dielectric constant larger than that of the air, such as a finger, approaches the second conductive film C2(h) in the air, the capacitance between the finger and the second conductive film C2(h) changes. A signal can be supplied in response to this change in the capacitance.

Specifically, a driving signal is supplied to the first conductive film C1(g), and the potential of the second conductive film C2(h) that changes in response to the driving signal and the capacitance is sensed and can be used as a sensor signal.

<<First Conductive Film C1(g)>>

A conductive material can be used for the first conductive film C1(g). For example, a material that can be used for the wiring 711 can be used for the first conductive film C1(g).

Specifically, a light-transmitting conductive material can be used for the first conductive film C1(g). For example, a conductive oxide such as indium oxide, indium tin oxide, indium zinc oxide, zinc oxide, or zinc oxide to which gallium is added can be used. Thus, a uniform electric field can be supplied without interfering with the display of the display element 750.

<<Second Conductive Film C2(h)>>

A conductive material can be used for the second conductive film C2(h). For example, a light-transmitting conductive material can be used for the second conductive film C2(h). Specifically, a conductive oxide or an oxide semiconductor can be used. For example, a material containing indium, gallium, zinc, and oxygen can be used.

As an example, an oxide semiconductor which is formed in the same process as the semiconductor film 718 and whose conductivity is increased by a method of controlling the resistivity of an oxide semiconductor can be used for the second conductive film C2(h). Thus, the second conductive film C2(h) can be formed with a simple process.

<<Insulating Film 701, Insulating Film 706, Insulating Film 721A, Insulating Film 721B, Insulating Film 728, Insulating Film 771>>

For example, an inorganic insulating material, an organic insulating material, or an insulating composite material containing an inorganic material and an organic material can be used for the insulating film 701, the insulating film 706, the insulating film 721A, the insulating film 721B, the insulating film 728, or the insulating film 771.

Specifically, an inorganic oxide film, an inorganic nitride film, an inorganic oxynitride film, or a stacked material in which a plurality of films selected from these are stacked can be used for the insulating film 701, the insulating film 706, the insulating film 721A, the insulating film 721B, the insulating film 728, or the insulating film 771. For example, a silicon oxide film, a silicon nitride film, a silicon oxynitride film, or a stacked material in which a plurality of films selected from these are stacked can be used.

Specifically, polyester, polyolefin, polyamide, polyimide, polycarbonate, polysiloxane, an acrylic resin, or the like; a stacked material or a composite material of a plurality of resins selected from these; or the like can be used for the insulating film 721A, the insulating film 721B, the insulating film 728, or the insulating film 771. Alternatively, a photosensitive material may be used for the formation. For example, polyimide, an epoxy resin, an acrylic resin, or the like can be used for the insulating film 771.

<<Display Element 750>>

For example, a display element having a function of controlling reflection or transmission of light can be used as the display element 750. For example, a structure in which a liquid crystal element and a polarizing plate are combined or a MEMS shutter display element can be used.

Specifically, it is possible to use a liquid crystal element that can be driven by a driving method such as an IPS (In-Plane-Switching) mode, a TN (Twisted Nematic) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, or an AFLC (AntiFerroelectric Liquid Crystal) mode.

In addition, a liquid crystal element that can be driven by a driving method, for example, a vertical alignment (VA) mode, specifically an MVA (Multi-Domain Vertical Alignment) mode, a PVA (Patterned Vertical Alignment) mode, an ASV mode, or the like can be used as the display element 750.

For example, the layer 753 containing the liquid crystal material and the first conductive film C1(g) and the third conductive film 751 that are arranged to enable application of an electric field for controlling the alignment of the liquid crystal material can be used in the display element 750.

<<Layer 753 Containing Liquid Crystal Material>>

For example, thermotropic liquid crystal, low-molecular liquid crystal, high-molecular liquid crystal, polymer dispersed liquid crystal, ferroelectric liquid crystal, antiferroelectric liquid crystal, or the like can be used. As these liquid crystal materials, a liquid crystal material that exhibits a cholesteric phase, a smectic phase, a cubic phase, a chiral nematic phase, an isotropic phase, or the like depending on conditions can be used. Alternatively, a liquid crystal material that exhibits a blue phase can be used for the layer 753 containing the liquid crystal material.

<<Third Conductive Film 751>>

A conductive material can be used for the third conductive film 751.

For example, a material that can be used for the wiring 711 can be used for the third conductive film 751. Specifically, a light-transmitting material can be used for the third conductive film 751. For example, a comb-like shape can be used for the third conductive film 751.

<<Transistor MA>>

For example, a bottom-gate or top-gate transistor can be used as the transistor MA.

As an example, a transistor having a lower leakage current in an off state than a transistor that uses amorphous silicon for a semiconductor film can be used as the transistor MA. Specifically, a transistor using an oxide semiconductor for the semiconductor film 718 can be used as the transistor MA.

Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute while occurrence of flickers is suppressed. Consequently, fatigue accumulation in a user of a data processing device can be reduced. Moreover, power consumption associated with driving can be reduced.

The transistor MA includes the semiconductor film 718 and the conductive film 704 having a region overlapping with the semiconductor film 718 (see FIG. 7(C)). The transistor MA also includes the conductive film 712A and the conductive film 712B.

Note that the conductive film 704 functions as the gate electrode, and the insulating film 706 functions as a gate insulating film. The conductive film 712A functions as one of the source electrode and the drain electrode, and the conductive film 712B functions as the other of the source electrode and the drain electrode.

<<Semiconductor Film 718>>

For example, an oxide semiconductor can be used for the semiconductor film 718. Specifically, an oxide semiconductor containing indium or an oxide semiconductor containing indium, gallium, and zinc can be used for the semiconductor film.

<<Gate Driver 301>>

A variety of sequential circuits such as a shift register, or the like can be used in the gate driver 301. For example, the transistor MD1, a capacitor, and the like can be used in the gate driver 301.

For example, a transistor including the conductive film 724 that has a region overlapping with the conductive film 704 functioning as a first gate electrode can be used as the transistor MD1. The transistor MD1 includes a stacked-layer film in which the insulating film 721A and the insulating film 721B are stacked, between the conductive film 724 and the semiconductor film 718. The conductive film 724 may be electrically connected to a wiring supplying the same potential as a potential supplied to the conductive film 704.

The gate driver 301 and the common driver 303 can be arranged to be stacked up. For example, the transistor MD2 included in the common driver 303 can be formed over the transistor MD1 included in the gate driver 301 as illustrated in FIG. 7(A).

<<Source Driver 302>>

For example, an integrated circuit can be used for the source driver. Specifically, an integrated circuit formed on a silicon substrate can be used.

The source driver can be mounted by a COG (Chip on glass) method, for example. Specifically, with the use of an anisotropic conductive film, the source driver can be mounted on a pad electrically connected to the signal line S(j).

The source driver is electrically connected to the second conductive films C2(1) to C2(q) and has a function of separating and amplifying signals that the second conductive films C2(1) to C2(q) receive, and the like.

<<Common Driver 303>>

The common driver is electrically connected to the first conductive films C1(1) to C1(p) and has a function of supplying signals to the first conductive films C1(1) to C1(p), and the like (see FIG. 3A).

<<Sealant 730>>

For example, an inorganic material, an organic material, a composite material of an inorganic material and an organic material, or the like can be used for the sealant 730.

For example, an organic material such as a thermally fusible resin or a curable resin, or an organic material such as a reactive curable adhesive, a photo-curable adhesive, a thermosetting adhesive, and/or an anaerobic adhesive can be used for the sealant 730.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 730.

<<Coloring Film CF>>

A material that transmits light of a predetermined color can be used for the coloring film CF. Thus, the coloring film CF can be used as a color filter, for example.

For example, a material that transmits blue light, a material that transmits green light, a material that transmits red light, a material that transmits yellow light, a material that transmits white light, or the like can be used for the coloring film CF.

<<Light-Blocking Film BM>>

A material that prevents light transmission can be used for the light-blocking film BM. Thus, the light-blocking film BM can be used as a black matrix, for example.

<<Structure KB>>

For example, an organic material, an inorganic material, or a composite material of an organic material and an inorganic material can be used for the structure KB. Thus, a predetermined space can be provided between components between which the structure KB is interposed.

Specifically, polyester, polyolefin, polyamide, polyimide, polycarbonate, polysiloxane, an acrylic resin, or the like; a composite material of a plurality of resins selected from these; or the like can be used for the structure KB. Alternatively, the structure KB may be formed using a photosensitive material.

Figure 8:
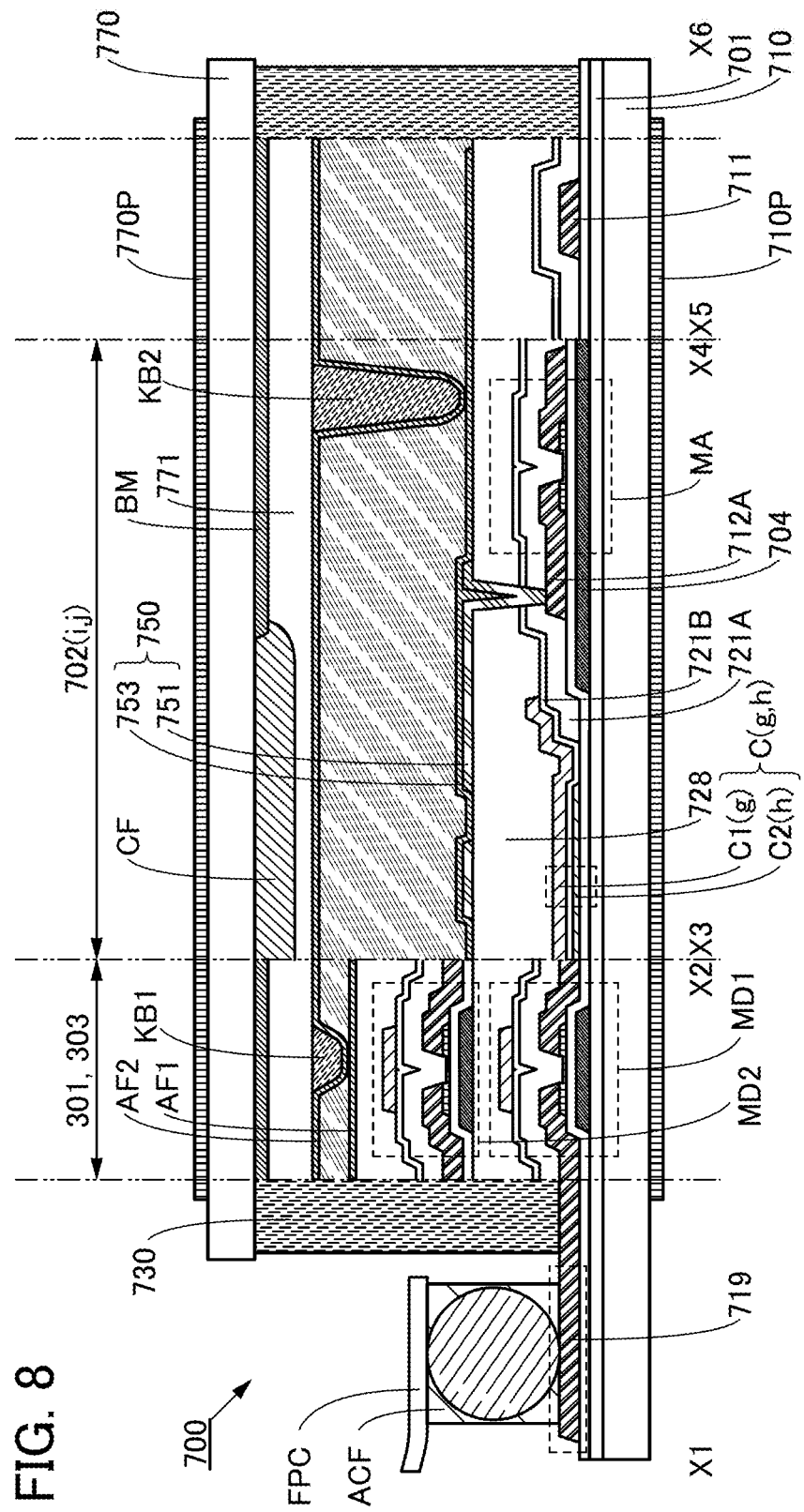
FIG. 8 is a cross-sectional view illustrating a display device.

Alternatively, as illustrated in FIG. 8, a structure KB1 in a region where the gate driver 301 and the common driver 303 are stacked up may be made smaller than a structure KB2 in the display region. Employing such a structure can achieve both the stack of the gate driver 301 and the common driver 303 and prevention of the increase in the thickness of the whole display device 700.

<<Alignment Film AF1, Alignment Film AF2>>

For example, polyimide or the like can be used for the alignment film AF1 or the alignment film AF2. Specifically, it is possible to use an alignment film that is formed using rubbing treatment or an optical alignment technique for alignment in a predetermined direction.

<<Optical Film 710P, Optical Film 770P>>

For example, a polarizing plate, a retardation plate, a diffusing film, an anti-reflective film, a light-condensing film, or the like can be used as the optical film 710P or the optical film 770P. Alternatively, a polarizing plate containing a dichromatic pigment can be used as the optical film 710P.

Alternatively, an antistatic film preventing attachment of a foreign substance, a water-repellent film making strain less likely to be attached, a hard coat film suppressing occurrence of a scratch in use, or the like can be used for the optical film 710P.

<Method of Controlling Resistivity of Oxide Semiconductor>

A method of controlling the resistivity of a film containing an oxide semiconductor will be described.

A film that contains an oxide semiconductor having predetermined resistivity can be used for the second conductive film C2(h) (see FIG. 7(A)).

For example, a method of controlling the concentration of impurities such as hydrogen and water included in an oxide semiconductor film and/or oxygen vacancies in the film can be used as the method of controlling the resistivity of an oxide semiconductor.

Specifically, plasma treatment can be used as a method for increasing or decreasing the concentration of impurities such as hydrogen and water and/or oxygen vacancies in the film.

Specifically, it is possible to employ plasma treatment using a gas containing one or more kinds selected from a rare gas (He, Ne, Ar, Kr, Xe), hydrogen, boron, phosphorus, and nitrogen. For example, it is possible to employ plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere. Thus, an oxide semiconductor film can be made to have a high carrier density and low resistivity.

Alternatively, hydrogen, boron, phosphorus, or nitrogen is added to an oxide semiconductor film by an ion implantation method, an ion doping method, a plasma immersion ion implantation method, or the like, so that the oxide semiconductor film can be made to have low resistivity.

Alternatively, it is possible to employ a method in which an insulating film containing hydrogen is formed in contact with an oxide semiconductor film and the hydrogen is diffused from the insulating film into the oxide semiconductor film. Thus, the carrier density of the oxide semiconductor film can be increased and the resistivity can be reduced.

For example, an insulating film in which the concentration of hydrogen contained in the film is greater than or equal to $1 \times 10^{22}$ atoms/cm$^3$ is formed in contact with an oxide semiconductor film, whereby hydrogen can be effectively included in the oxide semiconductor film. Specifically, a silicon nitride film can be used as the insulating film formed in contact with the oxide semiconductor film.

Hydrogen included in the oxide semiconductor film reacts with oxygen bonded to a metal atom and becomes water, and an oxygen vacancy is formed in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the oxide semiconductor film can be made to have a high carrier density and low resistivity.

Note that this embodiment can be combined with the other embodiments shown in this specification as appropriate.

Embodiment 2

In this embodiment, a structure of a transistor that can be used in the display device of one embodiment of the present invention will be described with reference to FIG. 12.

<Structure Example of Semiconductor Device>

Figure 12A:
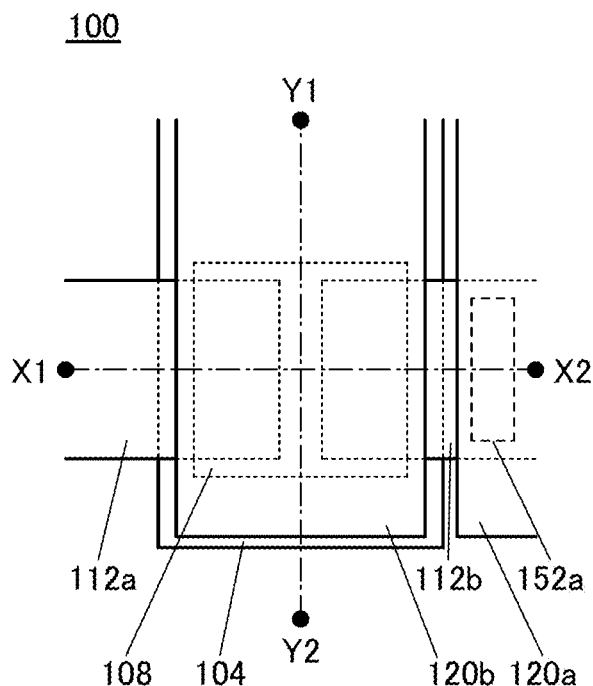
FIGS. 12A to 12C are a top view and cross-sectional views of a transistor.
Figure 12B:
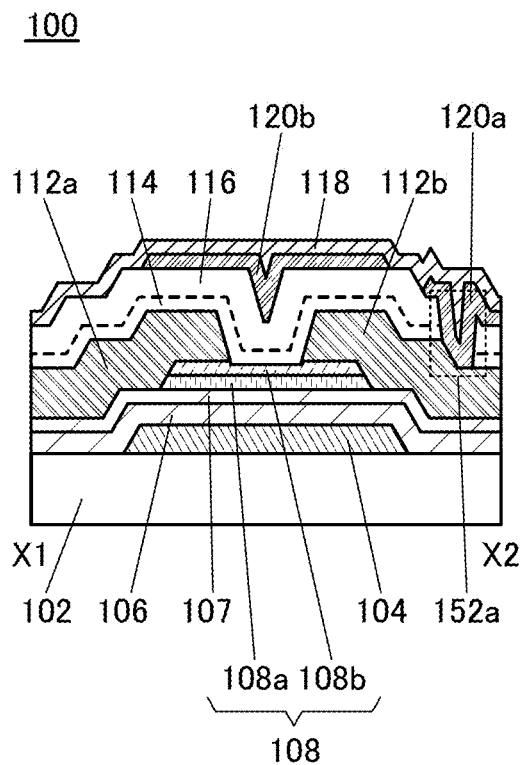
Figure 12C:
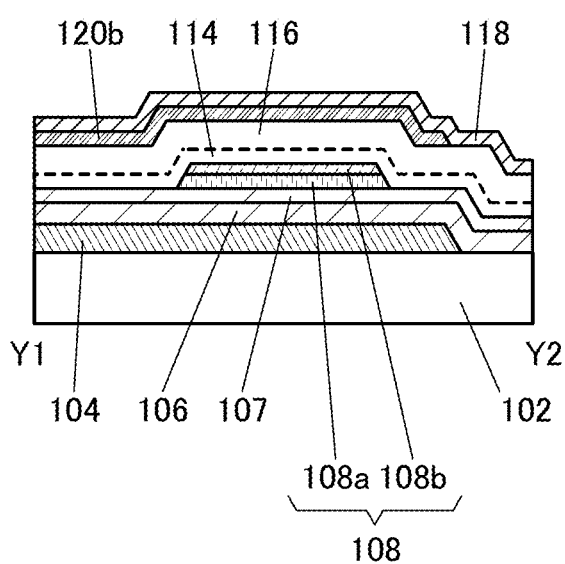

FIG. 12(A) is a top view of a transistor 100, FIG. 12(C) corresponds to a cross-sectional view of a cutting surface along the section line X1-X2 in FIG. 12(A), and FIG. 12(D) corresponds to a cross-sectional view of a cutting surface along the section line Y1-Y2 in FIG. 12(A). Note that in FIG. 12(A), some components of the transistor 100 (e.g., an insulating film serving as a gate insulating film) are not illustrated to avoid complexity. Furthermore, the direction of the section line X1-X2 may be called a channel length direction, and the direction of the section line Y1-Y2 may be called a channel width direction. As in FIG. 12(A), some components are not illustrated in some cases in top views of transistors described below.

The transistor 100 can be used in the display device described in Embodiment 1.

For example, when the transistor 100 is used as the transistor MA, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as a stacked material of the substrate 710 and the insulating film 701, the conductive film 704, 706, the semiconductor film 718, the conductive film 712A, the conductive film 712B, the insulating film 721A, and the insulating film 721B, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the conductive film 112a functioning as a source electrode electrically connected to the oxide semiconductor film 108, and the conductive film 112b functioning as a drain electrode electrically connected to the oxide semiconductor film 108. Over the transistor 100, specifically, over the conductive films 112a and 112b and the oxide semiconductor film 108, the insulating films 114 and 116 and the insulating film 118 are provided. The insulating films 114, 116, and 118 have a function of protective insulating films for the transistor 100.

The oxide semiconductor film 108 includes a first oxide semiconductor film 108a on the conductive film 104 side and a second oxide semiconductor film 108b over the first oxide semiconductor film 108a. The conductive film 104 serves as a gate electrode. The insulating film 106 and the insulating film 107 have a function of gate insulating films of the transistor 100.

In-M oxide (M is Ti, Ga, Sn, Y, Zr, La, Ce, Nd, or Hf) or In-M-Zn oxide can be used for the oxide semiconductor film 108. It is particularly preferable to use In-M-Zn oxide for the oxide semiconductor film 108.

The first oxide semiconductor film 108a includes a first region in which the atomic proportion of In is larger than the atomic proportion of M. The second oxide semiconductor film 108b includes a second region in which the atomic proportion of In is smaller than that in the first oxide semiconductor film 108a. The second region includes a portion thinner than the first region.

The first oxide semiconductor film 108a including the first region in which the atomic proportion of In is larger than that of M can increase the field-effect mobility (also simply referred to as mobility or µFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device having a narrow frame width (narrow frame) to be provided.

On the other hand, the first oxide semiconductor film 108a including the first region in which the atomic proportion of In is larger than that of M makes it easier to change electrical characteristics of the transistor 100 in light irradiation. However, in the semiconductor device of one embodiment of the present invention, the second oxide semiconductor film 108b is formed over the first oxide semiconductor film 108a. In addition, the thickness of the channel formation region in the second oxide semiconductor film 108b is smaller than the thickness of the first oxide semiconductor film 108a.

Furthermore, the second oxide semiconductor film 108b includes the second region in which the atomic proportion of In is smaller than that in the first oxide semiconductor film 108a and thus has larger Eg than the first oxide semiconductor film 108a. For this reason, the oxide semiconductor film 108 which is a stacked-layer structure of the first oxide semiconductor film 108a and the second oxide semiconductor film 108b has high resistance to a negative bias stress test with light irradiation.

When the oxide semiconductor film has the above-described structure, the amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen; this structure can further reduce the change in electrical characteristics of the transistor 100 due to light irradiation.

Here, the oxide semiconductor film 108 will be described in detail with reference to FIG. 12(B).

FIG. 12(B) is a cross-sectional enlarged view of the oxide semiconductor film 108 and the vicinity thereof in the transistor 100 illustrated in FIG. 12(A).

In FIG. 12(B), t1, t2-1, and t2-2 denote a thickness of the first oxide semiconductor film 108a and thicknesses of the second oxide semiconductor film 108b, respectively. The second oxide semiconductor film 108b over the first oxide semiconductor film 108a prevents the first oxide semiconductor film 108a from being exposed to an etching gas, an etchant, or the like when the conductive films 112a and 112b are formed. This is why the first oxide semiconductor film 108a is not or is hardly reduced in thickness. In contrast, in the second oxide semiconductor film 108b, a portion not overlapping with the conductive films 112a and 112b is etched when the conductive films 112a and 112b are formed, so that a depression is formed. In other words, a thickness of the second oxide semiconductor film 108b in a region overlapping with the conductive films 112a and 112b is t2-1, and a thickness of the second oxide semiconductor film 108b in a region not overlapping with the conductive films 112a and 112b is t2-2.

As for the relations between the thicknesses of the first oxide semiconductor film 108a and the second oxide semiconductor film 108b, t2-1>t1>t2-2 is preferable. A transistor with the thickness relations can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the first oxide semiconductor film 108a. In the structure of the transistor of one embodiment of the present invention, excess oxygen is introduced into the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the first oxide semiconductor film 108a.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like can be employed.

In order to fill oxygen vacancy in the first oxide semiconductor film 108a, the thickness of the portion including the channel formation region and the vicinity thereof in the second oxide semiconductor film 108b is preferably small; accordingly, a relation t2-2<t1 is preferably satisfied. For example, the thickness of the portion including the channel formation region and the vicinity thereof in the second oxide semiconductor film 108b is preferably more than or equal to 1 nm and less than or equal to 20 nm, further preferably more than or equal to 3 nm and less than or equal to 10 nm.

Other constituent elements of the semiconductor device of this embodiment are described below in detail.
<<Substrate>>
There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium or the like, an SOI substrate, or the like can be used as the substrate 102. Alternatively, any of these substrates provided with a semiconductor element may be used as the substrate 102.

<<Conductive Films Functioning as Gate Electrode, Source Electrode, and Drain Electrode>>

The conductive film 104 functioning as a gate electrode, the conductive film 112a functioning as a source electrode, and the conductive film 112b functioning as a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including the above-described metal element as its component; an alloy including a combination of the above-described metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. The use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one kind of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function of a blocking film which inhibits penetration of oxygen. For example, in the case where excess oxygen is supplied to the insulating films 107, 114, 116, and/or the oxide semiconductor film 108, the insulating film 106 can inhibit penetration of oxygen.

Note that the insulating film 107 that is in contact with the oxide semiconductor film 108 functioning as a channel formation region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In this embodiment, a silicon nitride film is formed as the insulating film 106, and a silicon oxide film is formed as the insulating film 107. A silicon nitride film has a higher dielectric constant than a silicon oxide film and needs a larger thickness for capacitance equivalent to that of the silicon oxide film. Thus, when the silicon nitride film is included in the gate insulating film of the transistor 150, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

For example, the first oxide semiconductor film 108a can be formed using the above-described sputtering target with In:M:Zn=2:1:3, In:M:Zn=3:1:2, or In:M:Zn=4:2:4.1. The second oxide semiconductor film 108b can be formed using the above-described sputtering target with In:M:Zn=1:1:1 or In:M:Zn=1:1:1.2. Note that the atomic ratio of metal elements in a sputtering target used for forming the second oxide semiconductor film 108b does not necessarily satisfy In≥M and Zn≥M, and the composition may satisfy In≥M and Zn<M As a specific example, In:M:Zn=1:3:2 or the like can be given.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the first oxide semiconductor film 108a, and an oxide semiconductor film having an energy gap more than or equal to 2.5 eV and less than or equal to 3.5 eV is preferably used as the second oxide semiconductor film 108b. Furthermore, the second oxide semiconductor film 108b preferably has a higher energy gap than that of the first oxide semiconductor film 108a.

Each thickness of the first oxide semiconductor film 108a and the second oxide semiconductor film 108b is more than or equal to 3 nm and less than or equal to 200 nm, preferably more than or equal to 3 nm and less than or equal to 100 nm, further preferably more than or equal to 3 nm and less than or equal to 50 nm. Note that the above-described thickness relations are preferably satisfied.

An oxide semiconductor film with low carrier density is used as the second oxide semiconductor film 108b. For example, the carrier density of the second oxide semiconductor film 108b is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS analysis is lower than or equal to $2 \times 10^{20}$ atoms/$cm^3$, preferably lower than or equal to $5 \times 10^{19}$ atoms/$cm^3$, further preferably lower than or equal to $1 \times 10^{19}$ atoms/$cm^3$, further preferably lower than or equal to $5 \times 10^{18}$ atoms/$cm^3$, further preferably lower than or equal to $1 \times 10^{18}$ atoms/$cm^3$, further preferably lower than or equal to $5 \times 10^{17}$ atoms/$cm^3$, and further preferably lower than or equal to $1 \times 10^{16}$ atoms/$cm^3$.

The first oxide semiconductor film 108a preferably includes a portion having lower hydrogen concentration than the second oxide semiconductor film 108b. When the first oxide semiconductor film 108a includes the portion having lower hydrogen concentration than the second oxide semiconductor film 108b, the semiconductor device can be highly reliable.

When silicon or carbon, which is one of elements belonging to Group 14, is included in the first oxide semiconductor film 108a, oxygen vacancy is increased in the first oxide semiconductor film 108a, and the first oxide semiconductor film 108a becomes n-type. Thus, the concentration of silicon or carbon in the first oxide semiconductor film 108a and the concentration of silicon or carbon (the concentration is measured by SIMS) in the vicinity of an interface with the first oxide semiconductor film 108a are set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the first oxide semiconductor film 108a, which is measured by SIMS analysis, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the first oxide semiconductor film 108a.

Furthermore, when including nitrogen, the first oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS analysis is preferably set to be, for example, lower than or equal to $5\times10^{18}$ atoms/cm$^3$.

<<Insulating Film Functioning as Protective Insulating Film of Transistor>>

The insulating films 114 and 116 have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film which can transmit oxygen. The insulating film 114 also functions as a film which relieves damage to the oxide semiconductor film 108 at the time of forming the insulating film 116 in a later step.

Silicon oxide, silicon oxynitride, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by ESR measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) of the oxide semiconductor film and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in thermal desorption spectrometry; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment by which the surface temperature of a film becomes higher than or equal to 50° C. and lower than or equal to 650° C., preferably higher than or equal to 50° C. and lower than or equal to 550° C.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in thermal desorption spectroscopy (TDS). Note that the temperature of the film surface in the TDS is preferably in a range higher than or equal to 100° C. and lower than or equal to 700° C., or higher than or equal to 100° C. and lower than or equal to 500° C.

Silicon oxide, silicon oxynitride, or the like with a thickness greater than or equal to 30 nm and less than or equal to 500 nm, preferably greater than or equal to 50 nm and less than or equal to 400 nm can be used as the insulating film 116.

Furthermore, the insulating films 114 and 116 can be formed using insulating films of the same kinds of materials; thus, a boundary between the insulating film 114 and the insulating film 116 cannot be clearly observed in some cases. Thus, in this embodiment, the boundary between the insulating film 114 and the insulating film 116 is shown by a dashed line. Although a two-layer structure of the insulating film 114 and the insulating film 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, hafnium oxynitride, and the like can be given.

Although the variety of films such as the conductive films, the insulating films, and the oxide semiconductor films which are described above can be formed by a sputtering method or a PECVD method, such films may be formed by another method, e.g., a thermal CVD (Chemical Vapor Deposition) method. Examples of the thermal CVD method include an MOCVD (Metal Organic Chemical Vapor Deposition) method and an ALD (Atomic Layer Deposition) method.

Deposition by a thermal CVD method may be performed in such a manner that a source gas and an oxidizer are supplied to the chamber at a time, the pressure in the chamber is set to an atmospheric pressure or a reduced pressure, and they are made to react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after the introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—ZnO film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an aluminum oxide film is formed with a deposition apparatus using ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

This embodiment can be combined with the other embodiments described in this specification as appropriate.

Embodiment 3

In this embodiment, another structure including the display device of one embodiment of the present invention will be described with reference to FIG. 9.

Figure 9A:
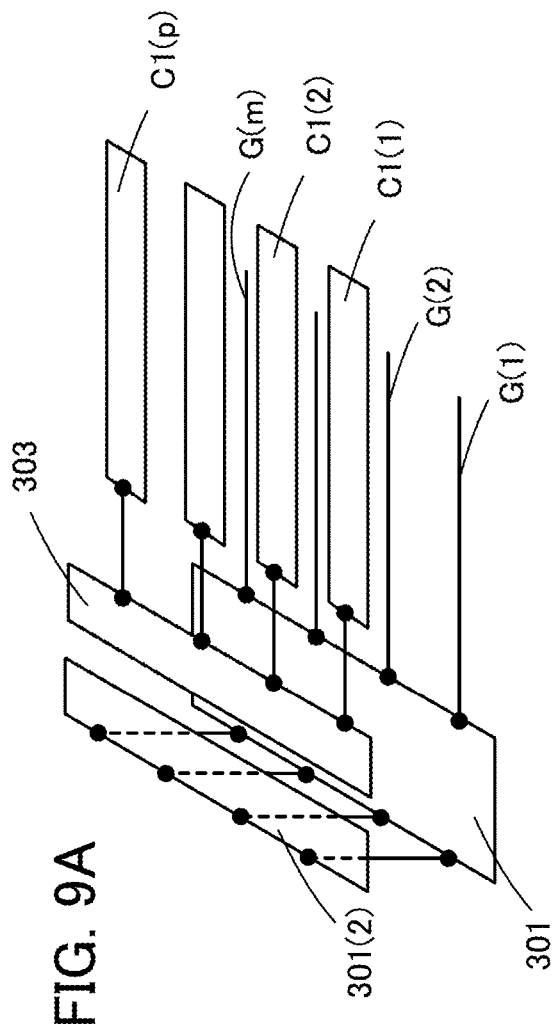
FIGS. 9A to 9B are a schematic view and a cross-sectional schematic view illustrating a driver circuit portion.

FIG. 9(A) is a schematic view illustrating a positional relation among the gate driver 301, a gate driver 301(2), and the common driver 303. Here, the gate driver 301(2) has a separated part of the function of the gate driver 301. The gate driver 301(2) and the common driver 303 are formed over the gate driver 301, and at least part of the gate driver 301(2) and at least part of the common driver 303 overlap with the gate driver 301.

The gate driver 301 is electrically connected to the first wirings G(1) to G(m) and the gate driver 301(2), and the common driver 303 is electrically connected to the first conductive films C1(1) to C1($p$).

The gate driver occupies a larger area than the common driver. Therefore, by dividing the function of the whole gate driver into the gate driver 301 and the gate driver 301(2) and stacking the gate drivers, the occupied area can be reduced. Here, the gate driver 301(2) and the common driver 303 are preferably formed on the same plane.

Figure 9B:
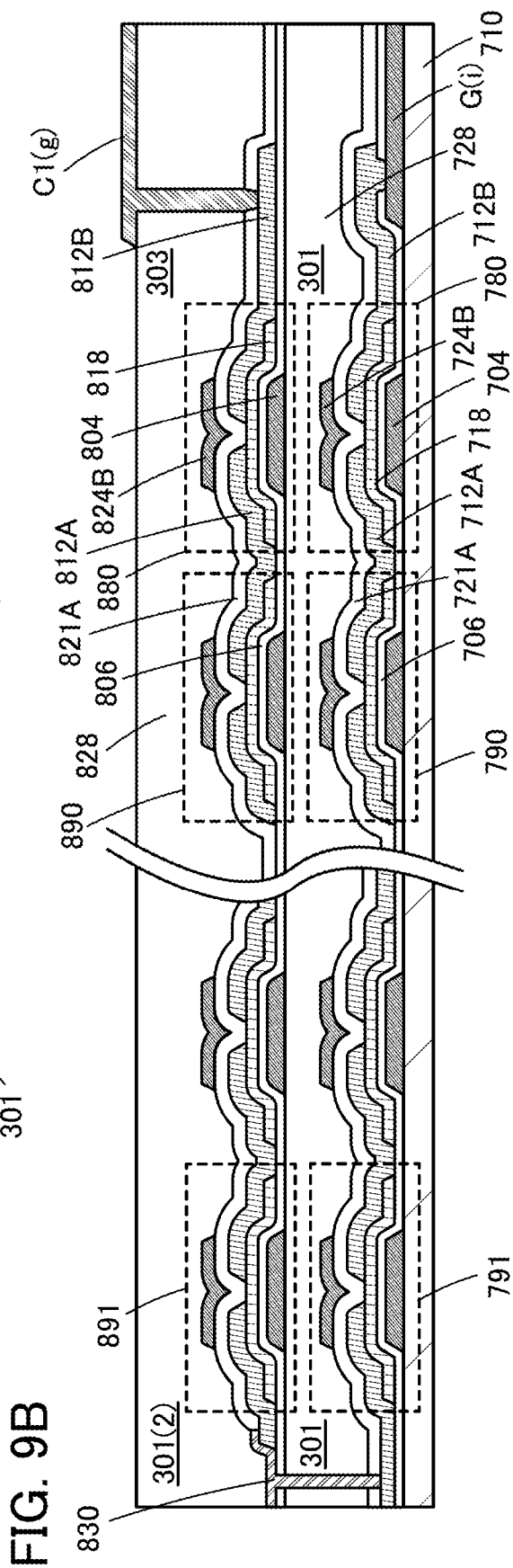

FIG. 9(B) is a cross-sectional schematic view illustrating a positional relation among the gate driver 301, the gate driver 301(2), and the common driver 303. The common driver 303 is formed over the gate driver 301 in a right region in FIG. 9(B), and the gate driver 301(2) is formed over the gate driver 301 in a left region in FIG. 9(B).

Here, a transistor 791 included in the gate driver 301 and a transistor 891 included in the gate driver 301(2) may be electrically connected to each other by a conductive film 830.

Note that the description of the other portions in FIG. 9 can be understood from the description in the above embodiments, e.g., the description of FIG. 2 and thus is omitted here.

Embodiment 4

In this embodiment, another structure including the display device of one embodiment of the present invention will be described with reference to FIG. 10.

Figure 10A:
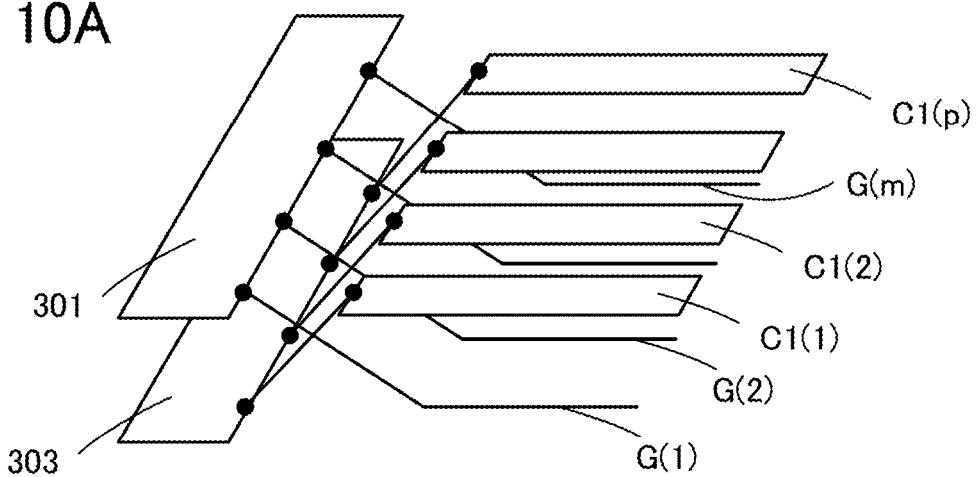
FIGS. 10A to 10C are a schematic view and cross-sectional schematic views illustrating a driver circuit portion.

FIG. 10(A) is a schematic view illustrating a positional relation between the gate driver 301 and the common driver 303. The gate driver 301 is formed over the common driver 303. Furthermore, the gate driver 301 is electrically connected to the first wirings G(1) to G(m), and the common driver 303 is electrically connected to the first conductive films C1(1) to C1($p$).

Figure 10B:
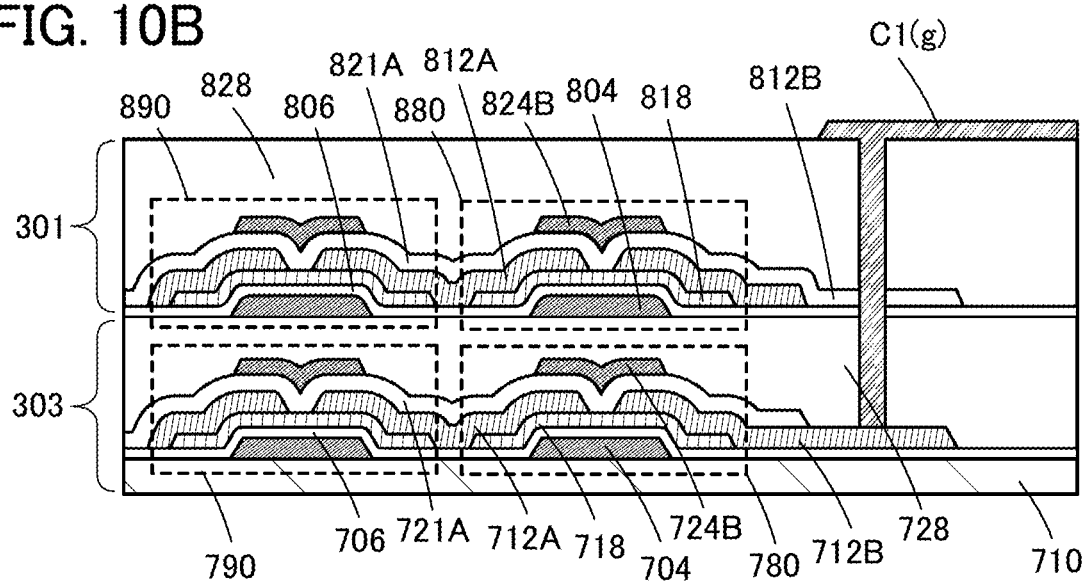
Figure 10C:
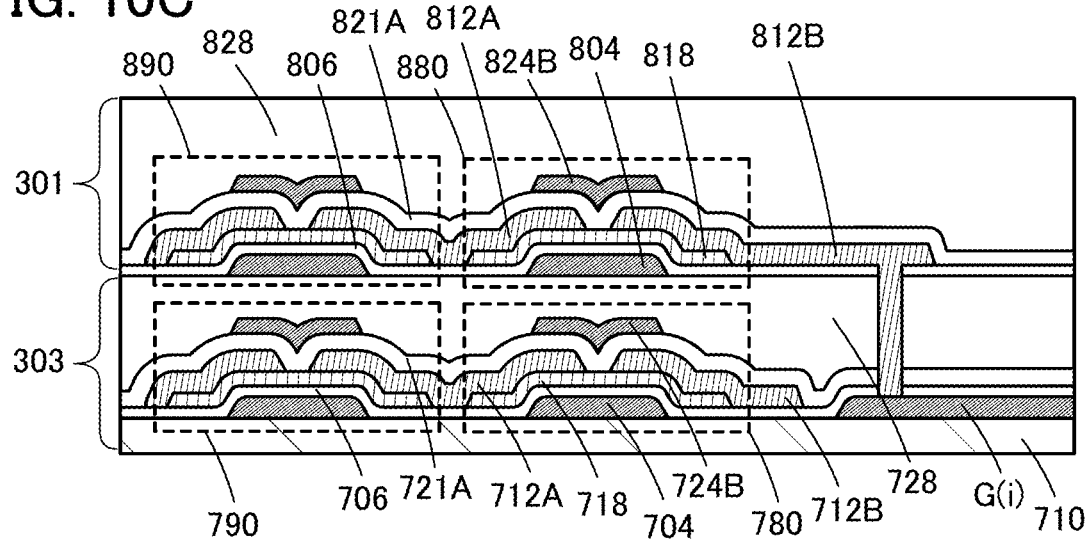

FIG. 10(B) is a cross-sectional schematic view of a position where the common driver 303 and the first conductive films C1(1) to C1($p$) are electrically connected to each other. FIG. 10(C) is a cross-sectional schematic view of a position where the gate driver 301 and the first wirings G(1) to G(m) are electrically connected to each other.

As illustrated in FIG. 10(A), the stacking order of the gate driver 301 and the common driver 303 and the stacking order of the first wirings G(1) to G(m) and the first conductive films C1(1) to C1($p$) are reversed.

In order to electrically connect the common driver 303 and the first conductive films C1(1) to C1(p), an opening needs to be provided in part of the gate driver 301. For example, as illustrated in FIG. 10(B), an opening is provided in part of an insulating film 828, the insulating film 812B, and the insulating film 728, and the first conductive film C1(g) is formed. Thus, the conductive film 712B and the first conductive film C1(g) can be electrically connected to each other.

Similarly, in order to electrically connect the gate driver 301 and the first wirings G(1) to G(m), an opening needs to be provided in part of the common driver 303. An example of a cross-sectional schematic view of a position different from that of FIG. 10(B) is illustrated in FIG. 10(C). As illustrated in FIG. 10(C), an opening is provided in part of the insulating film 806, the insulating film 728, the insulating film 721A, and the insulating film 706, and the conductive film 812B is formed. Thus, the conductive film 812B and the first wiring G(i) can be electrically connected to each other.

Note that the description of the other portions in FIG. 10 can be understood from the description in the above embodiments, e.g., the description of FIG. 2 and thus is omitted here.

Embodiment 5

In this embodiment, another structure including the display device of one embodiment of the present invention will be described with reference to FIG. 11.

FIG. 11(A) is a schematic view illustrating a positional relation among the gate driver 301, the gate driver 301(2), and the common driver 303. Here, the gate driver 301(2) has a separated part of the function of the gate driver 301. The gate driver 301 is formed over the gate driver 301(2) and the common driver 303, and at least part of the gate driver 301(2) and at least part of the common driver 303 overlap with the gate driver 301.

The gate driver 301 is electrically connected to the first wirings G(1) to G(m) and the gate driver 301(2), and the common driver 303 is electrically connected to the first conductive films C1(1) to C1(p).

The gate driver occupies a larger area than the common driver. Therefore, by dividing the function of the whole gate driver into the gate driver 301 and the gate driver 301(2) and stacking the gate drivers, the occupied area can be reduced. Here, the gate driver 301(2) and the common driver 303 are preferably formed on the same plane.

FIG. 11(B) is a cross-sectional schematic view of a position where the common driver 303 and the first conductive films C1(1) to C1(p) are electrically connected to each other.

As illustrated in FIG. 11(A), the stacking order of the gate driver 301 and the common driver 303 and the stacking order of the first wirings G(1) to G(m) and the first conductive films C1(1) to C1(p) are reversed.

In order to electrically connect the common driver 303 and the first conductive films C1(1) to C1(p), an opening needs to be provided in part of the gate driver 301. For example, a structure such as that illustrated in FIG. 11(B) allows the conductive film 712B and the first conductive film C1(g) to be electrically connected to each other.

Note that the description of the other portions in FIG. 11 can be understood from the description in the above embodiments, e.g., the description of FIG. 2, FIG. 9, and FIG. 10 and thus is omitted here.

Embodiment 6

In this embodiment, another structure including the display device of one embodiment of the present invention will be described with reference to FIG. 13. Note that a detailed description of the same components as those in Embodiment 1 to Embodiment 5 is omitted.

Figure 13:
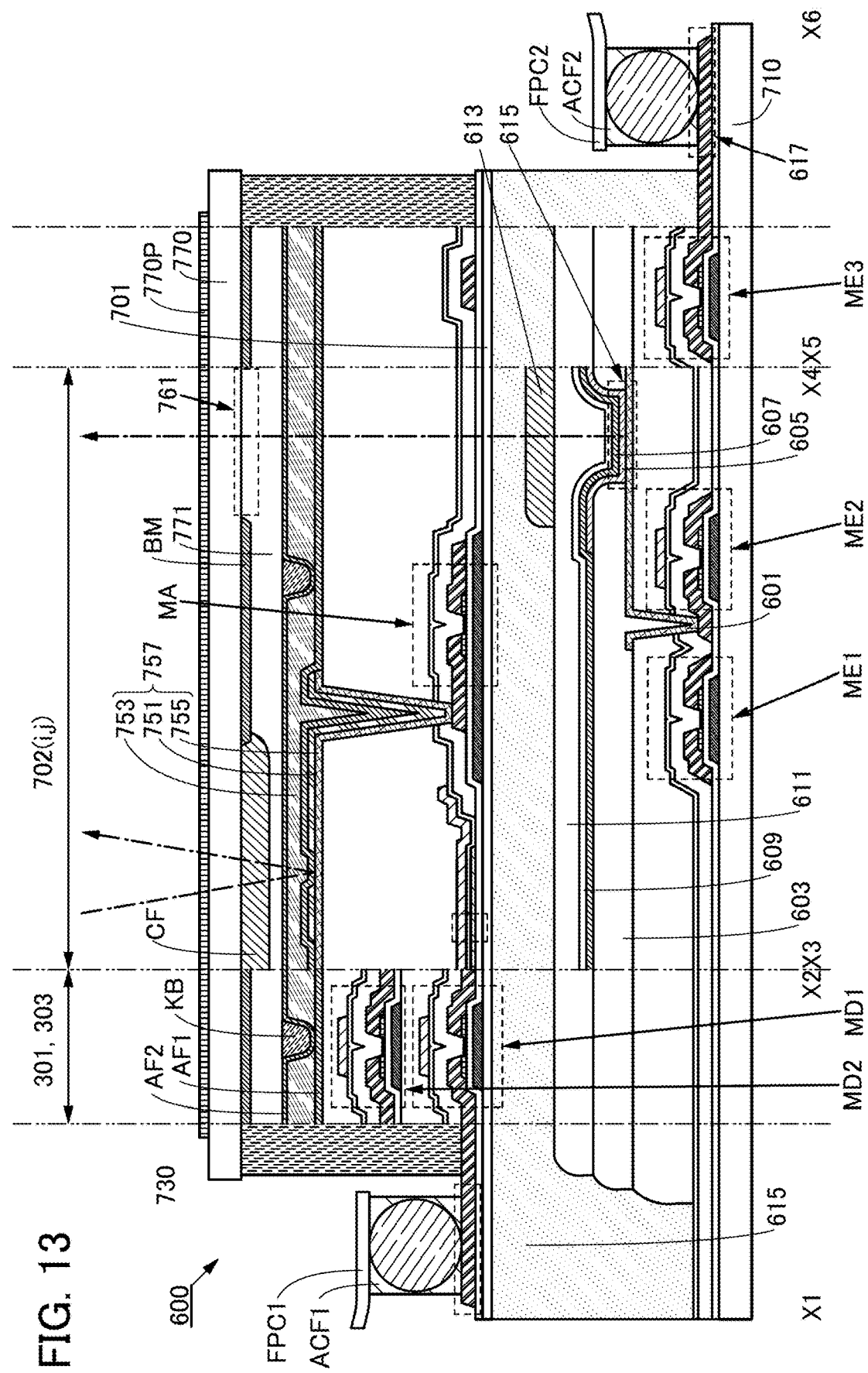
FIG. 13 is a cross-sectional view illustrating a display device.

FIG. 13 is a cross-sectional view illustrating a structure of a display device 600 of one embodiment of the present invention. The display device 600 includes a display element 757, the transistor MA electrically connected to the display element 757, the transistor MD1, and the transistor MD2. Furthermore, the display device 600 includes a display element 615 and a transistor ME1, a transistor ME2, and a transistor ME3 electrically connected to the display element 615.

As the display element 757, a reflective liquid crystal element can be used.

The display element 615 has a function of emitting light, that is, a light-emitting function. Therefore, the display element 615 may be rephrased as a light-emitting element. For example, a structure that uses an electroluminescent element (also referred to as an EL element), a structure that uses a light-emitting diode, or the like may be used for the display element 615.

Thus, display elements having different functions are used as the display element 757 and the display element 615. A display device that is highly convenient can be provided when a reflective liquid crystal element is used as one of the display elements and a transmissive EL element is used as the other thereof, for example. Furthermore, the display device can have low power consumption and high display quality when the reflective liquid crystal element is used in an environment with bright external light and the transmissive EL element is used in an environment with weak external light.

The display device 600 illustrated in FIG. 13 includes, between the substrate 710 and the substrate 770, the transistor MA, the transistor MD1, the transistor MD2, the transistor ME1, the transistor ME2, the transistor ME3, the display element 757, the display element 615, the insulating film 701, a coloring layer 613, the coloring layer CF, and the like. The substrate 770 and the insulating film 701 adhere to each other with the sealant 730. The substrate 710 and the insulating film 701 adhere to each other with an adhesive 619.

The display element 757 has a stacked-layer structure in which the conductive film 751 functioning as an electrode, the layer 753 containing the liquid crystal material, and a conductive film 755 are stacked. The alignment film AF1 is provided between the conductive film 751 and the layer 753 containing the liquid crystal material. The alignment film AF2 is provided between the layer 753 containing the liquid crystal material and the insulating film 701.

In the display element 757, the conductive film 755 has a function of reflecting visible light. Light entering from the substrate 770 side is polarized by the optical film 710P, passes through the layer 753 containing the liquid crystal material, and is reflected by the conductive film 755. Then, the light passes through the layer 753 containing the liquid crystal material and the coloring layer CF again and reaches the optical film 710P. At this time, alignment of the liquid crystal can be controlled with a voltage that is applied to the electrode 751, and thus optical modulation of light can be controlled. That is, the intensity of light emitted through the optical film 710P can be controlled. Light other than that in a particular wavelength region is absorbed by the coloring layer CF, so that red light is extracted, for example.

An opening 761 is provided in the light-blocking layer BM in a region overlapping with the display element 615.

The display element 615 is electrically connected to the transistor ME1, the transistor ME2, and the transistor ME3. The transistor ME1 is a transistor which controls the selected/nonselected state of a pixel including the display element 615 and sometimes referred to as a switching transistor or a selection transistor. The transistor ME2 is a transistor which controls the current flowing through the display element 615 and sometimes referred to as a driving transistor. The transistor ME3 has a function of the gate driver.

A terminal 617 electrically connected to a conductive film included in the transistor ME3 can be included. For example, a flexible printed circuit board FPC2 can be electrically connected to the terminal 617 using a conductive member ACF2. A signal or potential input from the connected FPC2 can be supplied to the display element 615 through the terminal 617.

Furthermore, the above-described structure of the transistor MA can be used as the structure of the transistor ME1. For example, the above-described structure of the transistor MD1 can be used as the structures of the transistor ME2 and the transistor ME3.

The display element 615 is a top-emission light-emitting element. The display element 615 has a stacked-layer structure in which a conductive film 601 functioning as a pixel electrode, an EL layer 605, and a conductive film 607 functioning as a common electrode are stacked in this order. The conductive film 601 is connected to a conductive film included in the transistor ME2. The transistor ME2 has a function of controlling driving of the display element 615. An insulating film 603 covers an end portion of the conductive film 601. The conductive film 601 contains a material that reflects visible light, and the conductive film 607 contains a material that transmits visible light. An insulating film 609 is provided so as to cover the conductive film 607.

An insulating film 611 is provided so as to cover the insulating film 609. The insulating film 611 has a function of a planarization layer. Note that the number of insulating films is not limited and may be one or two or more. The coloring layer 613 is provided in contact with the insulating layer 611.

Light emitted by the display element 615 is emitted to the substrate 770 side through the coloring layer 613, the insulating film 701, the opening 761, and the like.

The display element 757 and the display element 615 can exhibit various colors by the change of the color of the coloring layer among pixels. The display device 600 can perform color display using the display element 757. The display device 600 can perform color display using the display element 615.

In the display device 600, the transistor MA for driving the display element 757 and the transistor ME2 for driving the display element 615 are formed on different planes; thus, each of the transistors can be easily formed using a structure and a material suitable for driving the corresponding display element.

For the materials that can be used for the light-emitting element, the transistors, the insulating layers, the conductive layers, the adhesive layer, the connection layer, and the like, the description in Embodiment 1 to Embodiment 5 can be referred to.

Embodiment 7

In this embodiment, a display module and electronic appliances that include the display device of one embodiment of the present invention will be described with reference to FIG. 14.

FIG. 14(A) to FIG. 14(G) are drawings illustrating electronic appliances. These electronic appliances can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 14A:
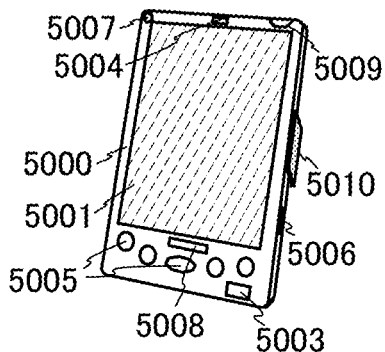
FIGS. 14A to 14H are diagrams illustrating electronic appliances.
Figure 14B:
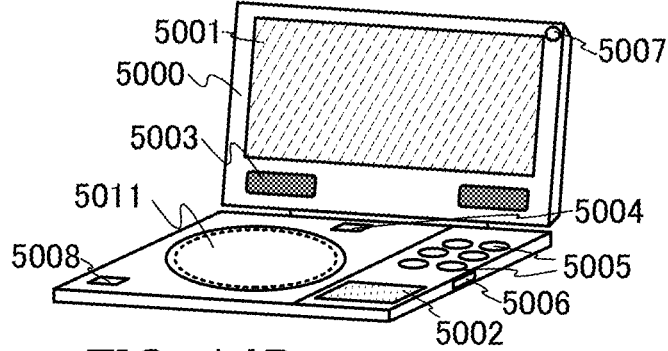
Figure 14C:
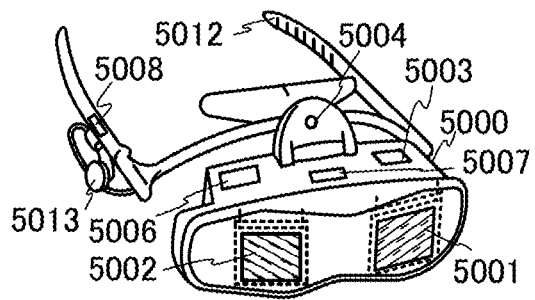
Figure 14D:
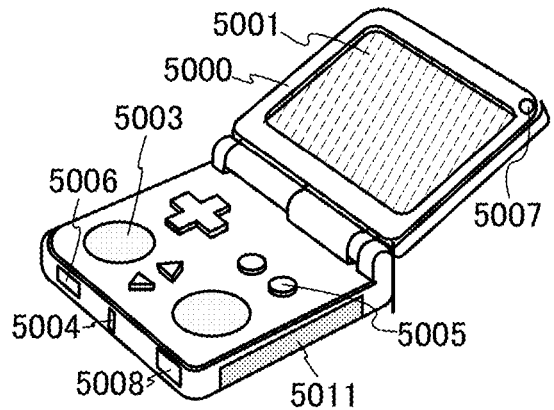
Figure 14E:
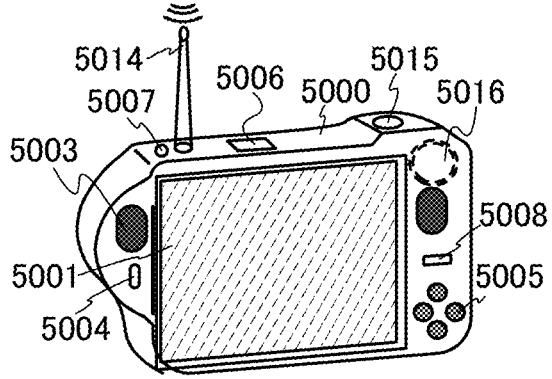
Figure 14F:
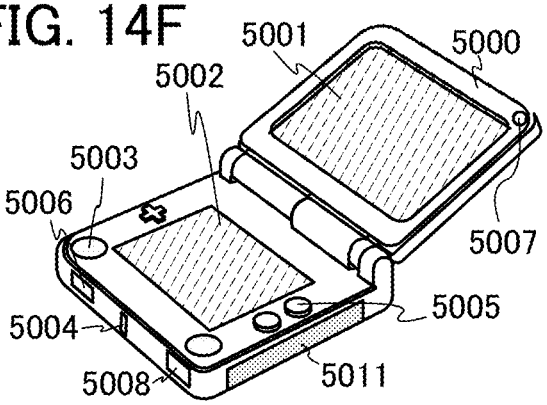
Figure 14G:
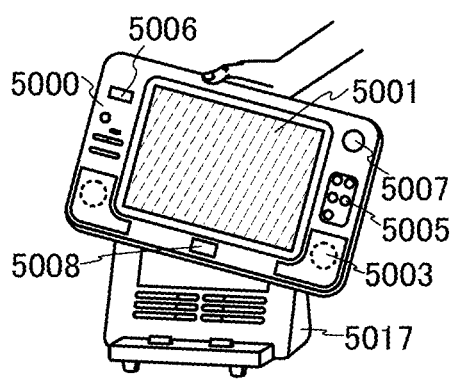

FIG. 14(A) illustrates a mobile computer that can include a switch 5009, an infrared port 5010, and the like in addition to the above components. FIG. 14(B) illustrates a portable image reproducing device (e.g., a DVD player) that is provided with a memory medium and can include a second display portion 5002, a memory medium reading portion 5011, and the like in addition to the above components. FIG. 14(C) illustrates a goggle-type display that can include the second display portion 5002, a support 5012, an earphone 5013, and the like in addition to the above components. FIG. 14(D) illustrates a portable game machine that can include the memory medium reading portion 5011 and the like in addition to the above components. FIG. 14(E) illustrates a digital camera that has a television reception function and can include an antenna 5014, a shutter button 5015, an image receiving portion 5016, and the like in addition to the above components. FIG. 14(F) illustrates a portable game machine that can include the second display portion 5002, the memory medium reading portion 5011, and the like in addition to the above components. FIG. 14(G) illustrates a portable television receiver that can include a charger 5017 capable of transmitting and receiving signals, and the like in addition to the above components.

The electronic appliances illustrated in FIG. 14(A) to FIG. 14(G) can have a variety of functions, for example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like. Furthermore, the electronic appliance including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic appliance including an image receiving portion can have a function of taking a still image, a function of taking a moving image, a function of automatically or manually correcting a taken image, a function of storing a taken image in a recording medium (an external recording medium or a recording medium incorporated in the camera), a function of displaying a taken image on the display portion, or the like. Note that functions that can be provided for the electronic appliances illustrated in FIG. 14(A) to FIG. 14(G) are not limited to those described above, and the electronic appliances can have a variety of functions.

Figure 14H:
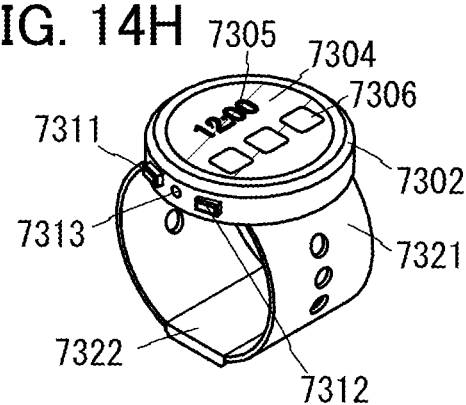

FIG. 14(H) illustrates a smart watch that includes a housing 7302, a display panel 7304, operation buttons 7311 and 7312, a connection terminal 7313, a band 7321, a clasp 7322, and the like.

The display panel 7304 mounted in the housing 7302 serving as a bezel portion includes a non-rectangular display region. The display panel 7304 may have a rectangular display region. The display panel 7304 can display an icon 7305 indicating time, another icon 7306, and the like.

Note that the smart watch illustrated in FIG. 14(H) can have a variety of functions, for example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using a light-emitting element for the display panel 7304.

Note that this embodiment can be combined with any of the other embodiments in this specification as appropriate.

REFERENCE NUMERALS

AF1 alignment film
AF2 alignment film
BM light-blocking film
C sensor
C1 conductive film
C2 conductive film
CF coloring film
G gate line
KB structure
MA transistor
ME transistor
MD transistor
S signal line
100 transistor
102 substrate
104 conductive film
106 insulating film
107 insulating film
108 oxide semiconductor film
112*a* conductive film
112*b* conductive film
114 insulating film
116 insulating film
118 insulating film
301 gate driver
302 source driver
303 common driver
305 display region
600 display device
601 conductive film
603 insulating film
605 EL layer
607 conductive film
609 insulating film
611 insulating film
613 coloring layer
615 display element
617 terminal
619 adhesive
700 display device
701 insulating film
702 pixel
704 conductive film
706 insulating film
710 substrate
710P optical film
711 wiring
712 conductive film
718 semiconductor film
719 terminal
721A insulating film
721B insulating film
724 conductive film
728 insulating film
730 sealant
750 display element
751 conductive film
753 layer containing a liquid crystal material
755 conductive film
757 display element
761 opening
770 substrate
770P optical film
771 insulating film
780 transistor
790 transistor
804 conductive film
806 insulating film
812 conductive film
818 semiconductor film
821A insulating film
821B insulating film
824B conductive film
828 insulating film
830 conductive film
880 transistor
890 transistor
891 transistor
5000 housing
5001 display portion
5002 display portion
5003 speaker
5004 LED lamp
5005 operation key
5006 connection terminal
5007 sensor
5008 microphone
5009 switch
5010 infrared port
5011 memory medium reading portion
5012 support
5013 earphone 5014 antenna
5015 shutter button
5016 image receiving portion
5017 charger
7302 housing
7304 display panel
7305 icon
7306 icon
7311 operation button
7312 operation button
7313 connection terminal
7321 band
7322 clasp

The invention claimed is:

1. A display device comprising:
a first driver circuit and a first wiring over a first substrate;
an insulating film over the first driver circuit; and
a second driver circuit and a second wiring over the insulating film,
wherein the first driver circuit and the second driver circuit at least partly overlap with each other, and
wherein one of the first driver circuit and the second driver circuit forms a gate driver and the other of the first driver circuit and the second driver circuit forms a common driver.

2. A display device comprising:
a first driver circuit and a first wiring over a first substrate;
an insulating film over the first driver circuit; and
a second driver circuit and a second wiring over the insulating film,
wherein the first driver circuit comprises a first transistor,
wherein the second driver circuit comprises a second transistor,
wherein one of a source and a drain of the first transistor is electrically connected to the first wiring,
wherein one of a source and a drain of the second transistor is electrically connected to the second wiring, and
wherein the first driver circuit and the second driver circuit at least partly overlap with each other, and
wherein one of the first driver circuit and the second driver circuit forms a gate driver and the other of the first driver circuit and the second driver circuit forms a common driver.

* * * * *